(12) United States Patent
Kim et al.

(10) Patent No.: US 11,776,440 B2
(45) Date of Patent: Oct. 3, 2023

(54) ELECTRONIC DEVICE INCLUDING FLEXIBLE DISPLAY AND METHOD OF OPERATING THE SAME

(71) Applicant: SAMSUNG ELECTRONICS CO., LTD., Suwon-si (KR)

(72) Inventors: Wankyu Kim, Suwon-si (KR); Raetae Kim, Suwon-si (KR); Bohyeon Kim, Suwon-si (KR); Byungwoo Min, Suwon-si (KR); Joongyeon Cho, Suwon-si (KR); Junwoo Choi, Suwon-si (KR); Jihea Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 32 days.

(21) Appl. No.: 17/515,990

(22) Filed: Nov. 1, 2021

(65) Prior Publication Data

US 2022/0148473 A1   May 12, 2022

Related U.S. Application Data

(63) Continuation of application No. PCT/KR2021/015227, filed on Oct. 27, 2021.

(30) Foreign Application Priority Data

Nov. 6, 2020 (KR) .................. 10-2020-0147810
Jan. 21, 2021 (KR) .................. 10-2021-0008453

(51) Int. Cl.
*G09G 3/00* (2006.01)
*G09G 3/3208* (2016.01)
(Continued)

(52) U.S. Cl.
CPC ........... *G09G 3/035* (2020.08); *G09G 3/3208* (2013.01); *H05K 5/0017* (2013.01);
(Continued)

(58) Field of Classification Search
CPC ............... G09G 3/035; G09G 3/3208; G09G 2330/021; G09G 2340/14; H01L 51/0097;
(Continued)

(56) References Cited

U.S. PATENT DOCUMENTS 10,719,104 B2 * 7/2020 Zhang .................. G06F 3/01
2003/0146897 A1   8/2003 Hunter
(Continued)

FOREIGN PATENT DOCUMENTS

CN   111078347 A * 4/2020
JP   2016-506566   3/2016
(Continued)

OTHER PUBLICATIONS

International Search Report and Written Opinion dated Feb. 8, 2022 in corresponding International Application No. PCT/KR2021/015227.

*Primary Examiner* — Doon Y Chow
(74) *Attorney, Agent, or Firm* — Nixon & Vanderhye P.C.

(57) ABSTRACT

An electronic device according to various embodiments may include: a housing, a battery, a flexible display including a first area and a second area extending from the first area and configured to move from the housing to change the size of an area visible to the front face of the electronic device, a sensor configured to identify information related to the size of the visible area of the display, and a processor, wherein the processor may be configured to: identify size information of the visible area of the display using the information received from the sensor, and control the display to display information related to an available usage time of the elec- (Continued)

tronic device based on the identified size information and the remaining amount of the battery.

17 Claims, 23 Drawing Sheets

(51) Int. Cl.
*H05K 5/00* (2006.01)
*H10K 77/10* (2023.01)
*H10K 102/00* (2023.01)

(52) U.S. Cl.
CPC ......... *H05K 5/0086* (2013.01); *H10K 77/111* (2023.02); *G09G 2330/021* (2013.01); *G09G 2340/14* (2013.01); *H10K 2102/311* (2023.02)

(58) Field of Classification Search
CPC .......... H01L 2251/5338; H05K 5/0017; H05K 5/0086
See application file for complete search history.

(56) References Cited

U.S. PATENT DOCUMENTS

| | | |
|---|---|---|
| 2014/0004906 A1 | 1/2014 | Chi et al. |
| 2014/0189583 A1 | 7/2014 | Yang |
| 2015/0241519 A1 | 8/2015 | Lee et al. |
| 2016/0127674 A1 | 5/2016 | Kim |
| 2016/0149429 A1 | 5/2016 | Lee et al. |
| 2016/0246959 A1* | 8/2016 | Lee ...................... H04N 21/278 |
| 2017/0154609 A1 | 6/2017 | Yoon et al. |
| 2018/0033406 A1 | 2/2018 | Park et al. |
| 2018/0234579 A1* | 8/2018 | Watanabe ................. B43L 1/04 |
| 2019/0278465 A1 | 9/2019 | Zhou et al. |
| 2019/0384438 A1 | 12/2019 | Park et al. |
| 2020/0209924 A1 | 7/2020 | Zuo |
| 2020/0409421 A1 | 12/2020 | Cho et al. |

FOREIGN PATENT DOCUMENTS

| | | |
|---|---|---|
| KR | 10-2014-0019978 | 2/2014 |
| KR | 10-2015-0099284 | 8/2015 |
| KR | 10-2016-0050689 | 5/2016 |
| KR | 10-2016-0073434 | 6/2016 |
| KR | 10-2017-0014886 | 2/2017 |
| KR | 10-2017-0062327 | 6/2017 |
| KR | 10-2018-0014494 | 2/2018 |
| KR | 10-1978206 | 5/2019 |
| KR | 10-2019-0106322 | 9/2019 |
| KR | 10-2019-0141518 | 12/2019 |
| WO | WO-2021249041 A1 * | 12/2021 |

* cited by examiner

ELECTRONIC DEVICE INCLUDING FLEXIBLE DISPLAY AND METHOD OF OPERATING THE SAME

CROSS-REFERENCE TO RELATED APPLICATIONS

This application is a continuation of International Application No. PCT/KR2021/015227 designating the United States, filed on Oct. 27, 2021, in the Korean Intellectual Property Receiving Office and claiming priority to Korean Patent Application No. 10-2020-0147810, filed on Nov. 6, 2020 and Korean Patent Application No. 10-2021-0008453, filed on Jan. 21, 2021, in the Korean Intellectual Property Office, the disclosures of which are incorporated by reference herein in their entireties.

BACKGROUND

Field

The disclosure relates to an electronic device including a flexible display and a method of operating the same.

Description of Related Art

Various services and additional functions provided through an electronic device, for example, a portable electronic device such as a smartphone, are gradually increasing. In order to increase the effective value of the electronic devices and satisfy the needs of various users, communication service providers or electronic device manufacturers are competitively developing electronic devices to provide various functions and differentiate the same from other companies. Accordingly, various functions provided through the electronic device are also significantly advancing.

As the demand for mobile communication increases and the degree of integration of electronic devices increases, portability of electronic devices such as smartphones may be improved, and convenience for using multimedia functions or the like may be improved. When surfing the web or using multimedia functions, using an electronic device capable of displaying a larger screen may provide convenience to the user. Although a larger display may be mounted to an electronic device to output a larger screen, there may be restrictions in expanding the size of the display in consideration of the portability of the electronic device. For example, the display using an organic light-emitting diode or the like can secure the portability of an electronic device while providing a larger screen. The display using an organic light-emitting diode (or an electronic device equipped with the same) can realize stable operation even when it is manufactured to be quite thin, so it can be mounted to an electronic device in a foldable, bendable, or rollable form.

In an electronic device including a flexible display, the display may be used such that the size thereof is changed by inserting or exposing a partial area of the display into or to the outside of the housing of the electronic device, and in the case of using the display in an expanded size of the exposed area by exposing a partial area of the display to the outside of the housing of the electronic device, power consumption of the battery may increase. In addition, if the power thereof is turned off in the state in which the size of the exposed area of the display is expanded by exposing a partial area of the display to the outside of the housing of the electronic device, the power may be turned off in the state of maintaining the expanded size of the exposed area.

SUMMARY

Embodiments of the disclosure provide an electronic device including a flexible display capable of reducing the size of the exposed area of the display and/or restricting expansion of the size of the exposed area depending on the battery power of the electronic device, and a method of operating the same.

According to various example embodiments, an electronic device may include: a housing, a battery; a flexible display including a first area and a second area extending from the first area and configured to move from the housing to change a size of an area visible to the front face of the electronic device, a sensor configured to identify information related to the size of the visible area of the display, and a processor, wherein the processor may be configured to: identify size information of the visible area of the display using information received from the sensor, and control the display to display information related to an available usage time of the electronic device based on the identified size information and a remaining amount of the battery.

According to various example embodiments, a method of operating an electronic device may include: identifying size information of an area of a flexible display, the area including a first area and a second area extending from the first area and configured to move from the housing of the electronic device to be visible to the front face of the electronic device, and displaying, on the display, information related to an available usage time of the electronic device based on the identified size information and a remaining amount of the battery.

According to various example embodiments, an electronic device including a flexible display can reduce power consumption of the battery of the electronic device by reducing the size of the exposed (e.g., visible) area of the display or restricting expansion of the size of the exposed (e.g., visible) area based on the battery power of the electronic device.

According to various example embodiments, when the power of the electronic device including the flexible display is turned off, the power of the electronic device can be turned off after reducing the size of the display to a default size.

According to various example embodiments, when the power of the electronic device including the flexible display is turned on, the electronic device can display a screen in the size of the display corresponding to the time at which the power of the electronic device is turned off.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
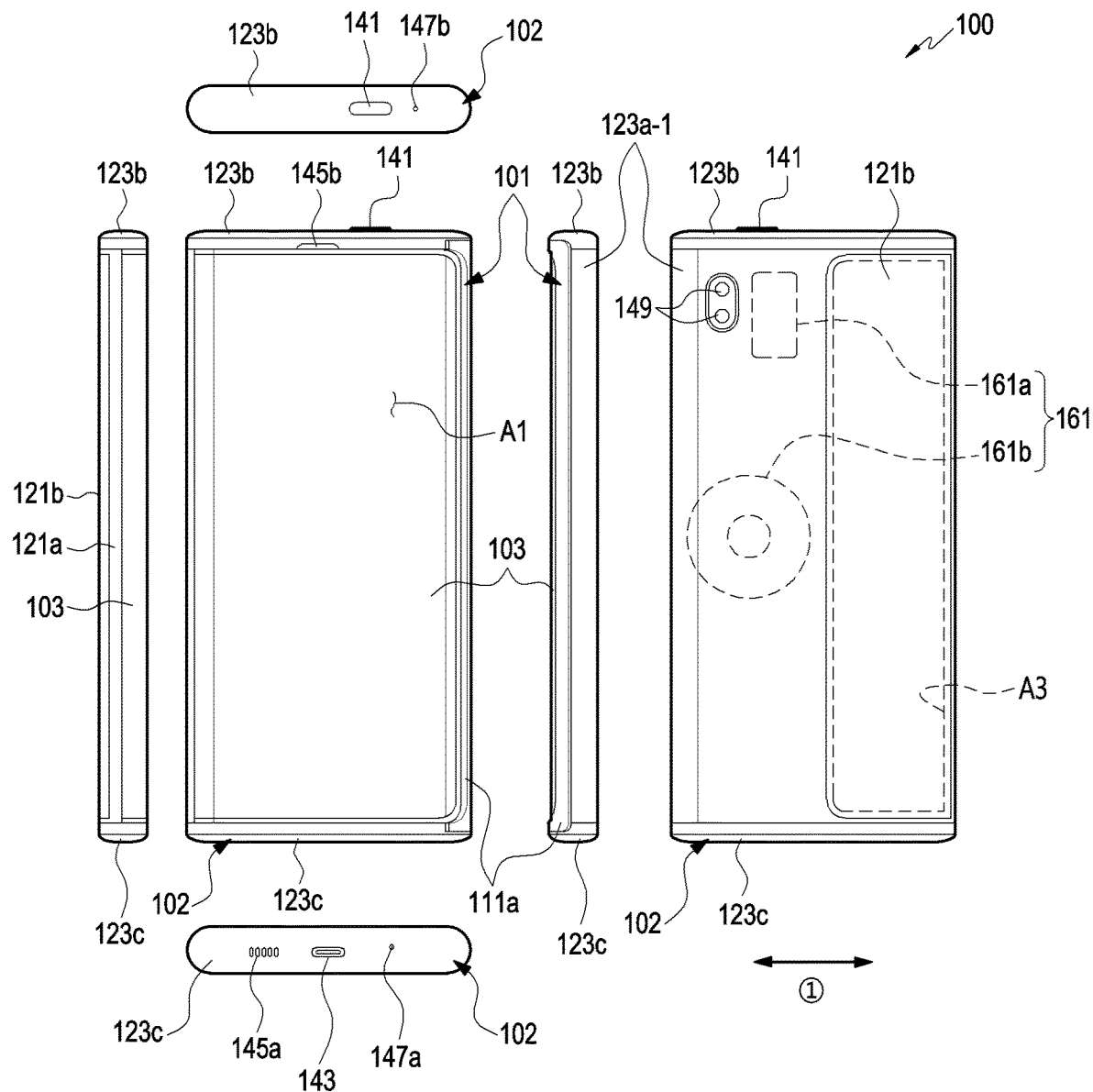
FIG. 1 is a diagram illustrating an electronic device in a state in which a portion of a flexible display is received inside a second housing according to various embodiments.
Figure 2:
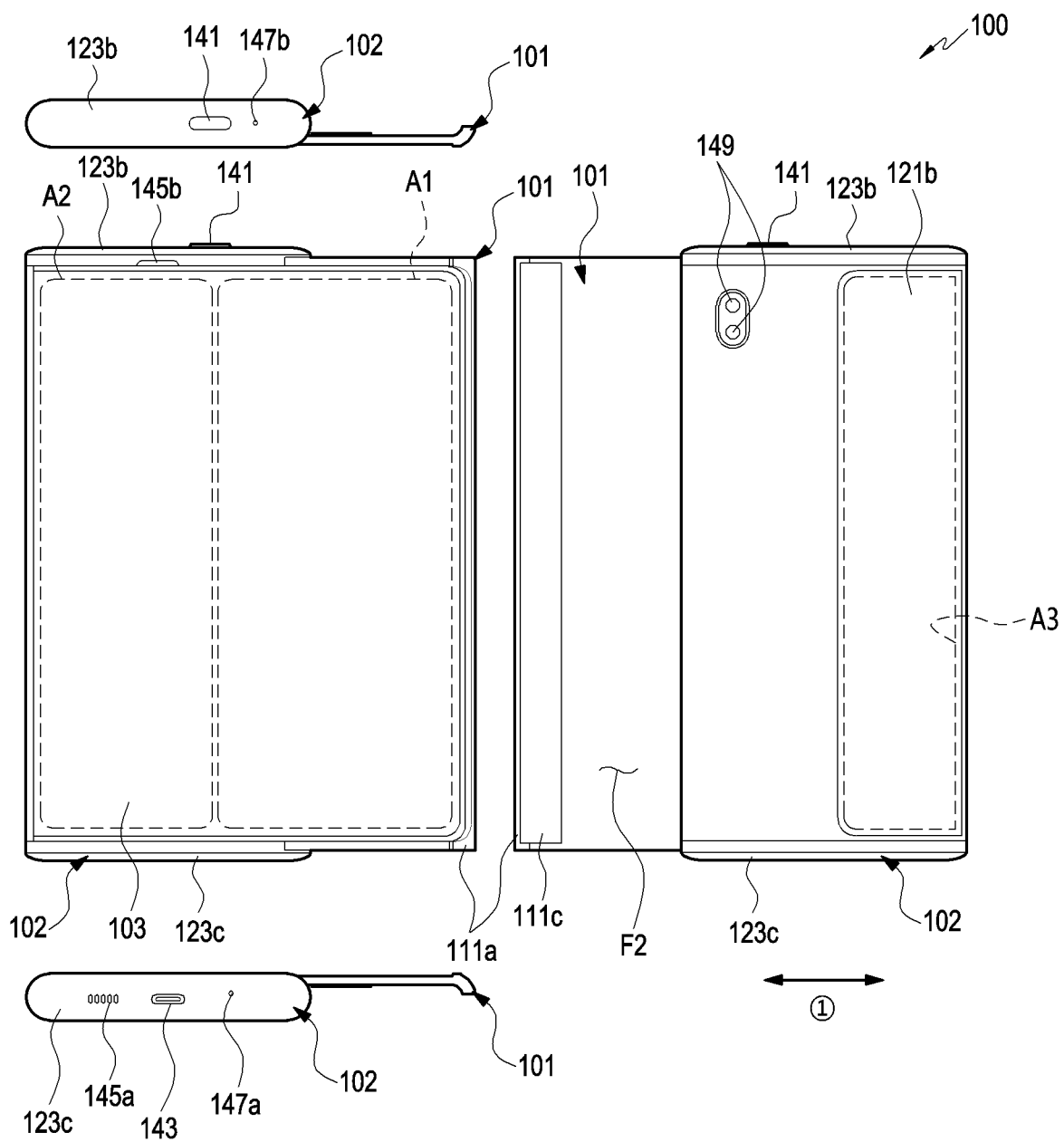
FIG. 2 is a diagram illustrating an electronic device in a state in which most of the flexible display is exposed to the outside of a second housing according to various embodiments.

FIG. 1 is a diagram illustrating an electronic device 100 in a state in which a portion (e.g., a second area A2) of a flexible display 103 is received inside a second structure (e.g., housing) 102 according to various embodiments. FIG. 2 is a diagram illustrating an electronic device 100 in a state in which most of the flexible display 103 is exposed to the outside of the second structure (e.g., housing) 102 according to various embodiments.

The state shown in FIG. 1 may be defined as that the first structure 101 is closed with respect to the second structure 102, and the state shown in FIG. 2 may be defined as that the first structure 101 is open with respect to the second structure 102. According to an embodiment, the "closed state" or "open state" may be defined as that the electronic device is in a closed state or open state. The electronic device 100 may include a first structure 101 and a second structure 102 that is movably disposed on the first structure 101. In various embodiments, it may be understood as the structure in which the first structure 101 is disposed to rollably move or slide on the second structure 102 in the electronic device 100. According to an embodiment, the first structure 101 may be disposed to reciprocate between the closed state and the open state in the illustrated direction, for example, in the direction indicated by the arrow ①, relative to the second structure 102. The term "structure" as used in this paragraph may be used interchangeably with the term "housing".

According to various embodiments, the first structure 101 may include a first plate 111a (e.g., a slide plate), and include a first face (see F1 in FIG. 3) including at least a portion of the first plate 111a and a second face F2 facing in the opposite direction of the first face F1. According to an embodiment, the second structure 102 may include a second plate (see 121a in FIG. 3) (e.g., a rear case), a first side wall 123a extending from the second plate 121a, a second side wall 123b extending from the first side wall 123a and the second plate 121a, a third side wall 123c extending from the first side wall 123a and the second plate 121a to be parallel to the second side wall 123b, and/or a rear plate 121b (e.g., a rear window). In some embodiments, the second side wall 123b and the third side wall 123c may be formed perpendicular to the first side wall 123a. According to an embodiment, the second plate 121a, the first side wall 123a, the second side wall 123b, and the third side wall 123c may be configured to have one side (e.g., a front face) that is open to accommodate (or surround) at least a portion of the first structure 101. For example, the first structure 101 may be coupled to the second structure 102 so as to be at least partially wrapped thereby, and may rollably move or slide in the direction parallel to the first face F1 or the second face F2, for example, in the direction of the arrow ①, while being guided by the second structure 102.

According to various embodiments, the second side wall 123b or the third side wall 123c may be omitted. According to an embodiment, the second plate 121a, the first side wall 123a, the second side wall 123b, and/or the third side wall 123c may be produced as separate structures and then be combined or assembled with each other. The rear plate 121b may be coupled to the second plate 121a so as to surround at least a portion thereof. In some embodiments, the rear plate 121b may be formed to be substantially integral with the second plate 121a. According to an embodiment, the second plate 121a or the rear plate 121b may cover at least a portion of the flexible display 103. For example, the flexible display 103 may be at least partially received inside the second structure 102, and the second plate 121a or the rear plate 121b may cover a portion (e.g., the second area A2) of the flexible display 103 that is received inside the second structure 102.

According to various embodiments, the first structure 101 may move in a first direction (e.g., the direction ①) parallel to the second plate 121a (e.g., the rear case) and the second side wall 123b between the open state and the closed state relative to the second structure 102, and move such that the first structure 101 is placed at a first distance from the first side wall 123a in the closed state and is placed at a second distance, which is greater than the first distance, from the first side wall 123a in the open state. In some embodiments, in the closed state, the first structure 101 may be positioned to surround a portion of the first side wall 123a.

According to various embodiments, the electronic device 100 may include a flexible display 103, a key input device 141, a connector hole 143, audio modules 145a, 145b, 147a, and 147b, or a camera module 149. Although not shown, the electronic device 100 may further include an indicator (e.g., an LED device) or various sensor modules.

According to various embodiments, the flexible display 103 may include a first area A1 and a second area A2. In an embodiment, the first area A1 may be disposed on the first face F1 to extend substantially across at least a portion of the first face F1. The second area A2 may extend from the first area A1, and may be inserted or received into the second structure 102 (e.g., a housing) or may be exposed to the outside of the second structure 102 according to the rolling movement or sliding movement of the first structure 101. As will be described later, the second area A2 moves while being substantially guided by a roller (see 151 in FIG. 3) mounted to the second structure 102 to be received inside the second structure 102 or exposed to the outside thereof. For example, a portion of the second area A2 may be deformed into a curved shape at the position corresponding to the roller 151 during the rolling movement or sliding movement of the first structure 101.

According to various embodiments, when viewed from the top of the first plate 111a (e.g., a slide plate), if the first structure 101 moves from the closed state to the open state, the second area A2 may be gradually exposed to the outside of the structure 102, thereby forming a substantially flat surface together with the first area A1. The flexible display 103 may be combined with a touch sensing circuit, a pressure sensor capable of measuring the intensity (pressure) of a touch, and/or a digitizer for detecting a magnetic field type stylus, or may be disposed adjacent thereto. In an embodiment, the second area A2 may be at least partially received inside the second structure 102, and a portion of the second area A2 may be exposed to the outside even in the state (e.g., the closed state) shown in FIG. 1. In some embodiments, the exposed portion of the second area A2 may be positioned on the roller 151, irrespective of the closed state or the open state, and the portion of the second area A2 may maintain a curved shape at the position corresponding to the roller 151.

The key input device 141 may be disposed on the second side wall 123b or the third side wall 123c of the second structure 102. In consideration of the appearance or use state, the illustrated key input device 141 may be omitted, or the electronic device 100 may be manufactured to include additional key input devices. In some embodiments, the electronic device 100 may include a key input device that is not shown in the drawing, for example, a home key button or a touch pad disposed around the home key button. According to another embodiment, at least a portion of the key input device 141 may be positioned in an area of the first structure 101.

According to various embodiments, the connector hole 143 may be omitted according to embodiments, and may accommodate a connector (e.g., a USB connector) for transmitting/receiving power and/or data to and from an external electronic device. Although not shown, the electronic device 100 may include a plurality of connector holes 143, and some of the plurality of connector holes 143 may function as connector holes for transmitting and receiving audio signals to and from an external electronic device. Although the connector hole 143 is disposed on the third side wall 123c in the illustrated embodiment, it should be noted that the disclosure is not limited thereto. For example, the connector hole 143 or an additional connector hole not shown may be disposed in the first side wall 123a or the second side wall 123b.

According to various embodiments, the audio modules 145a, 145b, 147a, and 147b may include speaker holes 145a and 145b or microphone holes 147a and 147b. One of the speaker holes 145a and 145b may be provided as a receiver hole for a voice call, and the other may be provided as an external speaker hole. The microphone halls 147a and 147b may have a microphone disposed therein to obtain an external sound, and in some embodiments, a plurality of microphones may be disposed to detect the direction of a sound. In some embodiments, the speaker holes 145a and 145b and the microphone holes 147a and 147b may be implemented as a single hole, or a speaker (e.g., a piezo speaker) may be included without the speaker holes 145a and 145b. According to an embodiment, the speaker hole indicated by reference numeral "145b" may be disposed in the first structure 101 to be utilized as a receiver hole for a voice call, and the speaker hole (e.g., an external speaker hole) indicated by reference numeral "145a" or the microphone holes 147a and 147b may be disposed in the second structure 102 (e.g., on one of the side surfaces 123a, 123b, and 123c).

The camera module 149 may be provided in the second structure 102 and photograph a subject in the direction opposite the first area A1 of the flexible display 103. The electronic device 100 may include a plurality of camera modules 149. For example, the electronic device 100 may include a wide-angle camera, a telephoto camera, or a close-up camera, and according to an embodiment, may measure a distance to a subject by including an infrared projector and/or an infrared receiver. The camera module 149 may include one or more lenses, an image sensor, and/or an image signal processor. Although not shown, the electronic device 100 may further include a camera module (e.g., a front camera) for photographing a subject in the same direction as the first area A1 of the flexible display 103. For example, the front camera may be disposed around the first area A1 or in an area overlapping the flexible display 103, and the front camera disposed in the area overlapping the flexible display 103 may photograph a subject by passing through the flexible display 103.

According to various embodiments, an indicator (not shown) of the electronic device 100 may be disposed in the first structure 101 or the second structure 102, and may include a light-emitting diode to provide information on the state of the electronic device 100 using a visual signal. A sensor module (not shown) of the electronic device 100 may produce an electrical signal or data value corresponding to an internal operating state of the electronic device 100 or an external environmental state. The sensor module may include, for example, a proximity sensor, a fingerprint sensor, or a biometric sensor (e.g., an iris/face recognition sensor or an HRM sensor). In another embodiment, the sensor module may further at least one of, for example, a gesture sensor, a gyro sensor, an atmospheric pressure sensor, a magnetic sensor, an acceleration sensor, a grip sensor, a color sensor, an infrared (IR) sensor, a temperature sensor, a humidity sensor, or an illuminance sensor.

Figure 3:
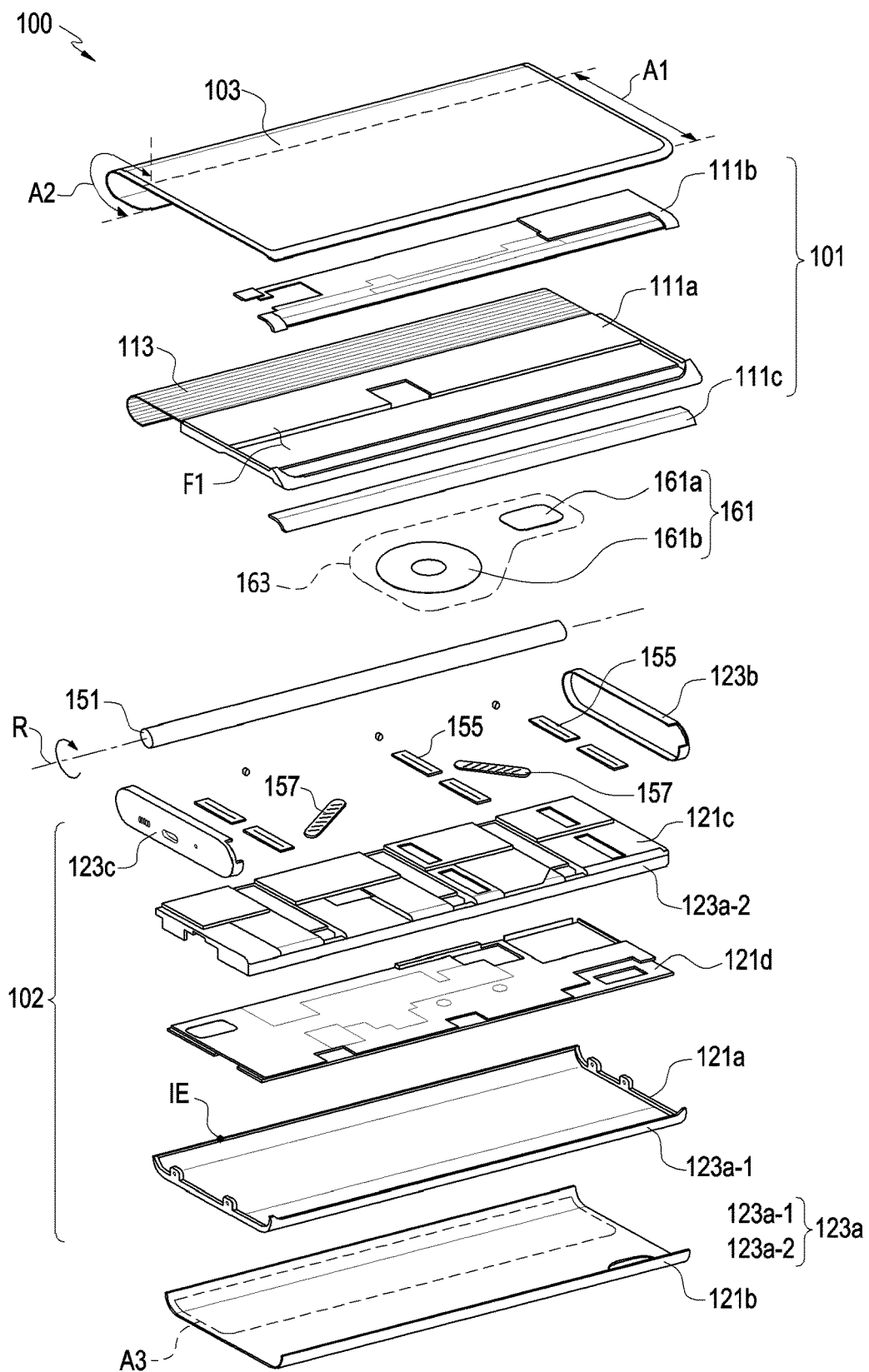
FIG. 3 is an exploded perspective view illustrating an electronic device according to various embodiments.
Figure 4:
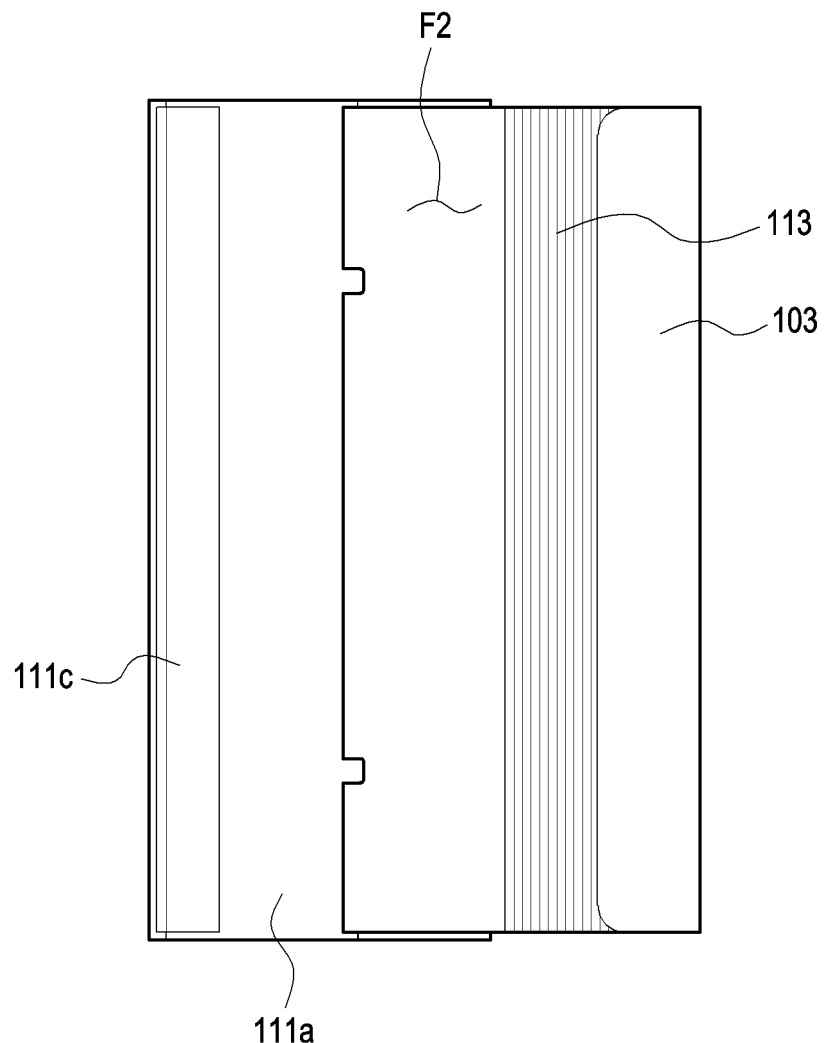
FIG. 4 is a bottom view illustrating a state in which a flexible display of an electronic device is mounted according to various embodiments.

FIG. 3 is an exploded perspective view illustrating an electronic device (e.g., the electronic device 100 in FIG. 1 or FIG. 2) according to various embodiments. FIG. 4 is a bottom view illustrating a state in which a flexible display 103 of an electronic device (e.g., the electronic device 100 in FIGS. 1 to 3) is mounted according to various embodiments.

Referring to FIGS. 3 and 4, the electronic device 100 may include a first structure 101, a second structure 102 (e.g., a housing), a display 103 (e.g., a flexible display), and a guide member (e.g., the roller 151), an articulated hinge structure 113, and/or at least one antenna structure 161. A portion of the display 103 (e.g., the second area A2) may be received inside the second structure 102 while being guided by the roller 151.

According to various embodiments, the first structure 101 may include a first plate 111a (e.g., a slide plate), and a first bracket 111b and/or a second bracket 111c mounted to the first plate 111a. The first structure 101, for example, the first plate 111a, the first bracket 111b, and/or the second bracket 111c, may be formed of a metal material and/or a non-metal (e.g., polymer) material. The first plate 111a may be mounted to the second structure 102 (e.g., a housing) and reciprocate linearly in one direction (e.g., the direction of arrow ① in FIG. 1) while being guided by the second structure 102. In an embodiment, the first bracket 111b may be coupled to the first plate 111a to form a first face F1 of the first structure 101 together with the first plate 111a. The first area A1 of the display 103 may be substantially mounted on the first face F1 to maintain the flat plate. The second bracket 111c may be coupled to the first plate 111a to form a second face F2 of the first structure 101 together with the first plate 111a. According to an embodiment, the first bracket 111b and/or the second bracket 111c may be integrally formed with the first plate 111a. This may be appropriately designed in consideration of the assembly structure of the manufactured product or manufacturing process thereof. The first structure 101 or the first plate 111a may be coupled to the second structure 102 to rollably move or slide with respect to the second structure 102.

According to various embodiments, the articulated hinge structure 113 may include a plurality of rods extending in a straight line and disposed parallel to the rotation axis R of the roller 151, and the plurality of rods may be arranged along the direction perpendicular to the rotation axis R, for example, the direction in which the first structure 101 rollably moves or slides. In an embodiment, the articulated hinge structure 113 may be connected to one end of the first structure 101 so as to move with respect to the second structure 102 according to the rolling movement or sliding movement of the first structure 101. For example, the articulated hinge structure 113 may be substantially received inside the second structure 102 in a closed state (e.g., the state shown in FIG. 1), and may be extracted to the outside of the second structure 102 in an open state (e.g., the state shown in FIG. 2). In some embodiments, a portion of the articulated hinge structure 113 may not be received inside the second structure 102 even in the closed state. For example, a portion of the articulated hinge structure 113 may be positioned to correspond to the roller 151 at the outside of the second structure 102 even in the closed state.

According to various embodiments, the rods of the articulated hinge structure 113 may rotate around neighboring rods while maintaining to be parallel to the neighboring rods. Thus, according to the rolling movement or sliding movement of the first structure 101, the articulated hinge structure 113 may form a curved surface at a portion facing the roller 151, and form a flat surface at a portion that does not face the roller 151. In an embodiment, the second area A2 of the display 103 may be mounted to or supported by the articulated hinge structure 113, and may be exposed to the outside of the second structure 102 together with the first area A1 in the open state (e.g., the state shown in FIG. 2). In the state in which the second area A2 is exposed to the outside of the second structure 102, the articulated hinge structure 113 may form a substantially flat surface, thereby supporting or maintaining the second area A2 in a flat state.

According to various embodiments, the second structure 102 (e.g., a housing) may include a second plate 121a (e.g., a rear case), a printed circuit board (not shown), a rear plate 121b, a third plate 121c (e.g., a front case), and a support member 121d. The second plate 121a, for example, the rear case, may be disposed to face in the direction opposite the first face F1 of the first plate 111a and substantially provide external appearance of the second structure 102 or the electronic device 100. In an embodiment, the second structure 102 may include a first side wall 123a extending from the second plate 121a, a second side wall 123b extending from the second plate 121a to be substantially perpendicular to the first side wall 123a, and a third side wall 123c extending from the second plate 121a to be substantially perpendicular to the first side wall 123a and parallel to the second side wall 123b. Although the illustrated embodiment shows the structure in which the second side wall 123b and the third side wall 123c are manufactured as separate parts from the second plate 121a and then mounted or assembled to the second plate 121a, they may be formed integrally with the second plate 121a.

According to various embodiments, the rear plate 121b may be coupled to the outer surface of the second plate 121a, and may be manufactured to be integral with the second plate 121a according to embodiments. In an embodiment, the second plate 121a may be made of a metal or polymer material, and the rear plate 121b may be made of a material such as metal, glass, synthetic resin, or ceramic to provide a decorative effect on the appearance of the electronic device 100. According to an embodiment, the second plate 121a and/or the rear plate 121b may be made of a material that transmits light at least partially (e.g., an auxiliary display area A3). In an embodiment, in the state in which a portion of the display 103 (e.g., the second area A2) is received inside the second structure 102, at least a portion of the second area A2 may be positioned corresponding to the auxiliary display area A3. For example, the display 103 may output a screen using at least a portion of the second area A2 in the state of being received inside the second structure 102, and the user may recognize the screen output through the auxiliary display area A3.

According to various embodiments, the third plate 121c may be made of a metal or polymer material, and may be coupled to the second plate 121a (e.g., the rear case), the first side wall 123a, the second side wall 123b, and/or the third side wall 123c to form an inner space of the second structure 102. According to an embodiment, the third plate 121c may be referred to as a "front case", and the first structure 101, for example, the first plate 111a, may rollably move or slide while substantially facing the third plate 121c. In some embodiments, the first side wall 123a may be configured by a combination of a first side wall portion 123a-1 extending from the second plate 121a and a second side wall portion 123a-2 formed on one edge of the third plate 121c. In another embodiment, the first side wall portion 123*a*-1 may be combined to surround one edge of the third plate 121*c*, for example, the second side wall portion 123*a*-2, and in this case, the first side wall portion 123*a*-1 itself may form the first side wall 123*a*.

According to various embodiments, a support member 121*d* may be disposed in the space between the second plate 121*a* and the third plate 121*c*, and may be made of a metal or polymer material in a planer shape. The support member 121*d* may provide an electromagnetic shielding structure in the inner space of the second structure 102 or improve the mechanical rigidity of the second structure 102. In an embodiment, when received inside the second structure 102, the articulated hinge structure 113 and/or a partial area of the display 103 (e.g., the second area A2) may be positioned in the space between the second plate 121*a* and the support member 121*d*.

According to various embodiments, a printed circuit board, which is not shown in the drawing, may be disposed in the space between the third plate 121*c* and the support member 121*d*. For example, the printed circuit board may be accommodated in a space separated by the support member 121*d* from the space in which the articulated hinge structure 113 and/or a partial area of the display 103 is accommodated in the second structure 102. The printed circuit board may have a processor, a memory, and/or an interface mounted thereto. The processor may include, for example, one or more of a central processing unit, an application processor, a graphic processing unit, an image signal processor, a sensor hub processor, and a communication processor.

The memory may include, for example, volatile memory or non-volatile memory.

The interface may include, for example, a high definition multimedia interface (HDMI), a universal serial bus (USB) interface, an SD card interface, and/or an audio interface. The interface may electrically or physically connect, for example, the electronic device 100 to an external electronic device and include a USB connector, an SD card/MMC connector, or an audio connector.

According to various embodiments, the display 103 may be a flexible display based on an organic light-emitting diode, and may be at least partially deformed into a curved shape while generally maintaining a planar shape. In an embodiment, the first area A1 of the display 103 may be mounted or attached to the first face F1 of the first structure 101 to maintain a substantially planar shape. The second area A2 may extend from the first area A1, and may be supported by or attached to the articulated hinge structure 113. For example, the second area A2 may extend along the direction of the rolling movement or sliding movement of the first structure 101, may be received inside the second structure 102 together with the articulated hinge structure 113, and may be at least partially deformed to a curved shape according to the deformation of the articulated hinge structure 113.

According to various embodiments, as the first structure 101 rollably moves or slides on the second structure 102, the area of the display 103 exposed to the outside may vary. The electronic device 100 (e.g., the processor) may change the area of the display 103 that is activated on the basis of the area of the display 103 exposed to the outside. For example, the electronic device 100 may activate the area exposed to the outside of the second structure 102, among the entire area of the display 103, in the open state or at an intermediate position between the closed state and the open state. In the closed state, the electronic device 100 may activate the first area A1 of the display 103 and inactivate the second area A2 thereof. In the closed state, if there is no user input for a predetermined time (e.g., 30 seconds or 2 minutes), the electronic device 100 may inactivate the entire area of the display 103. In some embodiments, in the state in which the entire area of the display 103 is inactive, the electronic device 100 may activate some areas of the display 103 as necessary (e.g., notification according to user settings and notification of missed calls/reception of messages), thereby providing visual information through the auxiliary display area A3.

According to various embodiments, in the open state (e.g., the state shown in FIG. 2), substantially the entire area of the display 103 (e.g., the first area A1 and the second area A2) may be exposed to the outside, and the first area A1 and the second area A2 may be arranged to form a plane. In an embodiment, even in the open state, a portion (e.g., one end) of the second area A2 may be positioned to correspond to the roller 151, and the portion corresponding to the roller 151 in the second area A2 may be maintained in a curved shape. For example, in various embodiments disclosed in this document, although it is stated that "the second area A2 is arranged to form a plane in the open state", a portion of the second area A2 may be maintained in a curved shape, and similarly, although it is stated that "the articulated hinge structure 113 and/or the second area A2 are received inside the second structure 102 in the closed state", a portion of the articulated hinge structure 113 and/or the second area A2 may be positioned outside the second structure 102.

According to various embodiments, a guide member, for example, the roller 151, may be rotatably mounted to the second structure 102 (e.g., the second plate 121*a*) at a position adjacent to one edge of the second structure 102. For example, the roller 151 may be disposed adjacent to the edge of the second plate 121*a* (e.g., the portion indicated by reference number "IE") parallel to the first side wall 123*a*. Although reference numerals are not given in the drawings, another side wall may extend from the edge of the second plate 121*a* adjacent to the roller 151, and the side wall adjacent to the roller 151 may be substantially parallel to the first side wall 123*a*. In an embodiment, the side wall of the second structure 102 adjacent to the roller 151 may be made of a material that transmits light, and a portion of the second area A2 may provide visual information through a portion of the second structure 102 in the state of being received inside the second structure 102.

According to various embodiments, one end of the roller 151 may be rotatably coupled to the second side wall 123*b*, and the opposite end thereof may be rotatably coupled to the third side wall 123*c*. For example, the roller 151 may be mounted to the second structure 102 and rotate around the rotation axis R that is perpendicular to the direction of the rolling movement or sliding movement of the first structure 101 (e.g., the direction of arrow ① in FIG. 1 or FIG. 2). The rotation axis R may be disposed substantially parallel to the first side wall 123*a* to be far from the first side wall 123*a*, and, for example, may be positioned at one edge of the second plate 121*a*. In an embodiment, the gap between the outer circumferential surface of the roller 151 and the inner surface of the edge of the second plate 121*a* may form an entrance through which the articulated hinge structure 113 or the display 103 enters the inside of the second structure 102.

According to various embodiments, when the display 103 is deformed into a curved shape, the roller 151 may maintain the radius of curvature of the display 103 to a certain degree, thereby suppressing excessive deformation of the display 103. "Excessive deformation" may indicate that the display 103 is deformed to have an excessively small radius of curvature to the extent that pixels or signal wires included in the display 103 are damaged. For example, the display 103 may be moved or deformed while being guided by the roller 151 to be protected from damage due to excessive deformation. In some embodiments, the roller 151 may rotate while the articulated hinge structure 113 or the display 103 is inserted into or extracted from the second structure 102. For example, the articulated hinge structure 113 (or the display 103) may be effectively inserted into/extracted from the second structure 102 by suppressing or preventing friction between the articulated hinge structure 113 (or the display 103) and the second structure 102.

According to various embodiments, the electronic device 100 may further include guide rails 155 and/or actuating members 157. The guide rail(s) 155 may be mounted to the second structure 102, for example, the third plate 121c, to guide the rolling movement or sliding movement of the first structure 101 (e.g., the first plate 111a or the slide plate). The actuating member(s) 157 may include a spring or a spring module that provides an elastic force in the direction in which both ends thereof moves away from each other, and one end of the actuating member(s) 157 may be rotatably supported by the second structure 102 and the opposite end thereof may be rotatably supported by the first structure 101.

According to various embodiments, when the first structure 101 rollably moves or slides, both ends of the actuating member(s) 157 may be positioned closest to each other at a point between the closed state and the open state (hereinafter, a "closest point"). For example, the actuating member(s) 157 may provide an elastic force to the first structure 101 in the direction to move toward the closed state in the section between the closest point and the closed state, and the actuating member(s) 157 may provide an elastic force to the first structure 101 in the direction to move toward the open state in the section between the closest point and the open state.

According to various embodiments, the antenna structure 161 may be disposed in at least one of the first structure 101 or the second structure 102. The antenna structure 161 may include an electrically conductive body, for example, a loop antenna configured as arrangement of electrically conductive lines, on a plane or plate. In some embodiments, the antenna structure 161 may include a patch antenna, a monopole antenna, a dipole antenna, or an inverted F-antenna depending on the arrangement or shape of the conductive body. The antenna structure may be configured to perform, for example, at least one communication among near field communication, wireless power transmission/reception, and magnetic secure transmission. However, it should be noted that wireless communication performed through the antenna structure 161 is not limited thereto. For example, the electronic device 100 may access a mobile or cellular communication network, a local area network (LAN), a wireless local area network (WLAN), a wide area network (WAN), the Internet, or a small area network (SAN) using the antenna structure 161. According to an embodiment, the antenna structure 161 may include a first antenna 161a for magnetic secure transmission (MST) and/or near field communication, and a second antenna 161b for near field communication and/or wireless power transmission. In some embodiments, the first antenna 161a may be configured to perform near field communication and/or wireless power transmission, and the second antenna 161b may be utilized for magnetic secure transmission.

Figure 5A:
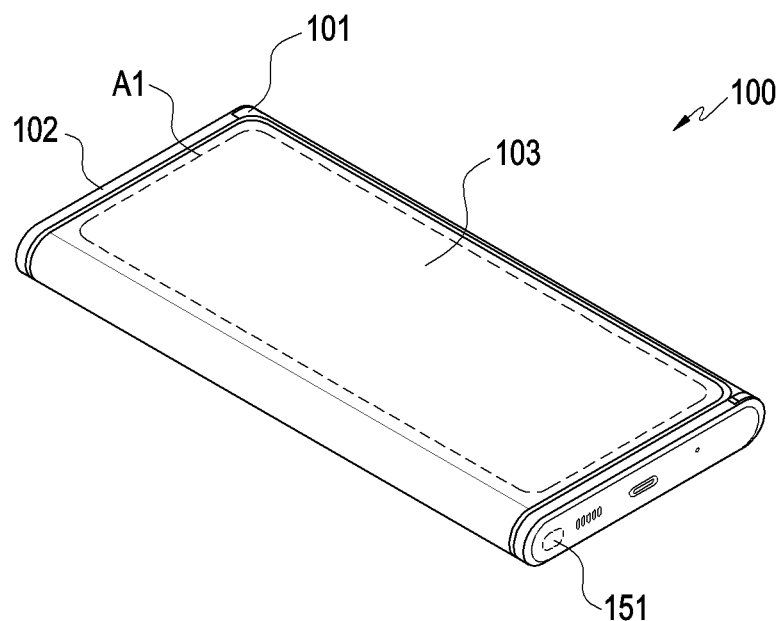
FIG. 5A is a perspective view of an electronic device in a state in which a second area of a flexible display is inserted into a housing according to various embodiments.
Figure 5B:
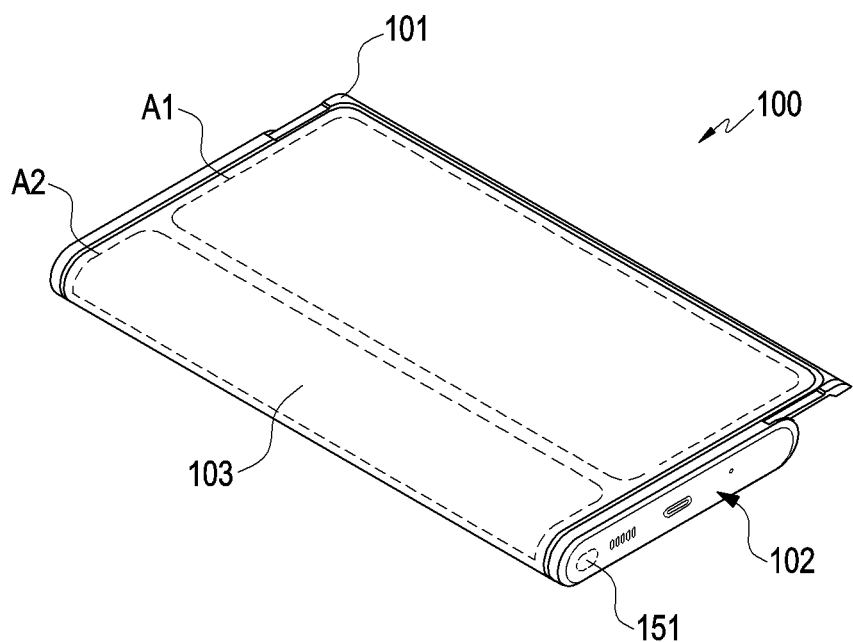
FIG. 5B is a perspective view of an electronic device in a state in which a portion of a second area of a flexible display is exposed to the outside of the housing according to various embodiments.
Figure 5C:
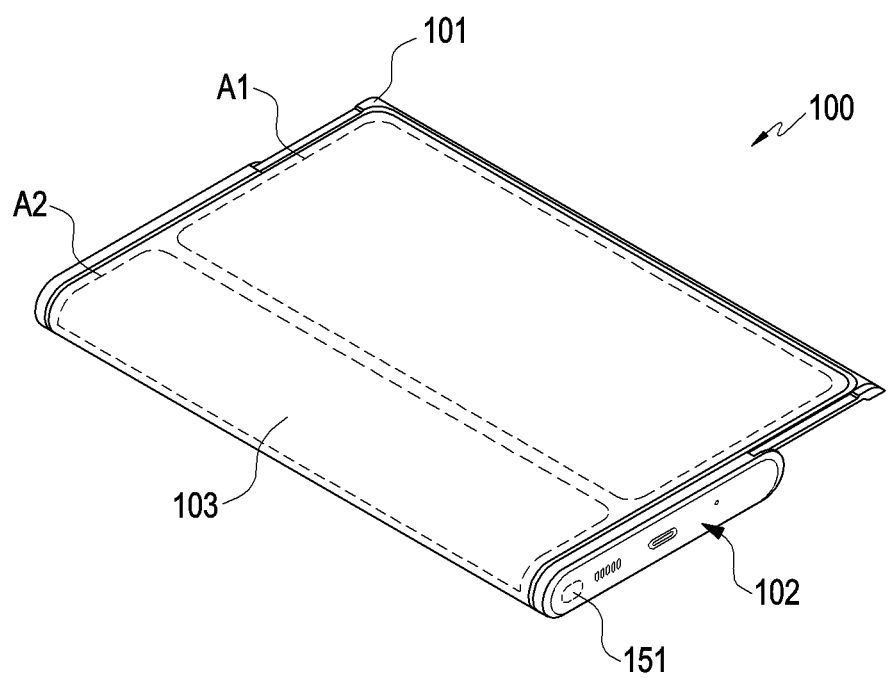
FIG. 5C is a perspective view of an electronic device in a state in which the entirety of a second area of a flexible display is exposed to the outside of the housing according to various embodiments.

FIG. 5A is a perspective view of an electronic device illustrating a state in which a second area of a flexible display is inserted into a housing according to various embodiments. FIG. 5B is a perspective view of an electronic device illustrating a state in which a portion of a second area of a flexible display is exposed to the outside of the housing according to various embodiments. FIG. 5C is a perspective view illustrating a state in which the entirety of a second area of a flexible display is exposed to the outside of the housing according to various embodiments.

Referring to FIGS. 5A, 5B and 5C (which may be referred to hereinafter as FIGS. 5A to 5C), the electronic device 100 may include a second structure 102 (housing), a first structure 101 movably disposed in the second structure 102, and a roller 151 for driving the first structure 101 to slide on the second structure 102.

A flexible display 103 may be disposed in the first structure 101, and a first area A1 of the flexible display 103 may be visually exposed to the outside of the second structure 102, and a second area A2 of the flexible display 103 may be visually exposed (e.g., visible) to the outside of the second structure 102 or inserted into the second structure 102 according to sliding movement of the first structure 101.

FIG. 5A shows a first state in which the first area A1 of the flexible display 103 is exposed to the outside of the second structure 102 (housing) and in which the second area A2 is inserted into the second structure 102 so that only the first area A1 of the flexible display 103 is exposed.

FIG. 5B shows a second state in which the first area A1 of the flexible display 103 is exposed to the outside of the second structure 102 (housing) and in which a portion of the second area A2 is exposed to the outside of the second structure 102 according to the sliding movement of the first structure 101 so that the first area A1 and a portion of the second area A2 of the flexible display 103 are exposed.

FIG. 5C shows a third state in which the first area A1 of the flexible display 103 is exposed to the outside of the second structure 102 (housing) and in which the entirety of the second area A2 is exposed to the outside of the second structure 102 according to the sliding movement of the first structure 101 so that the first area A1 and the entirety of the second area A2 of the display 103 are exposed.

Figure 6:
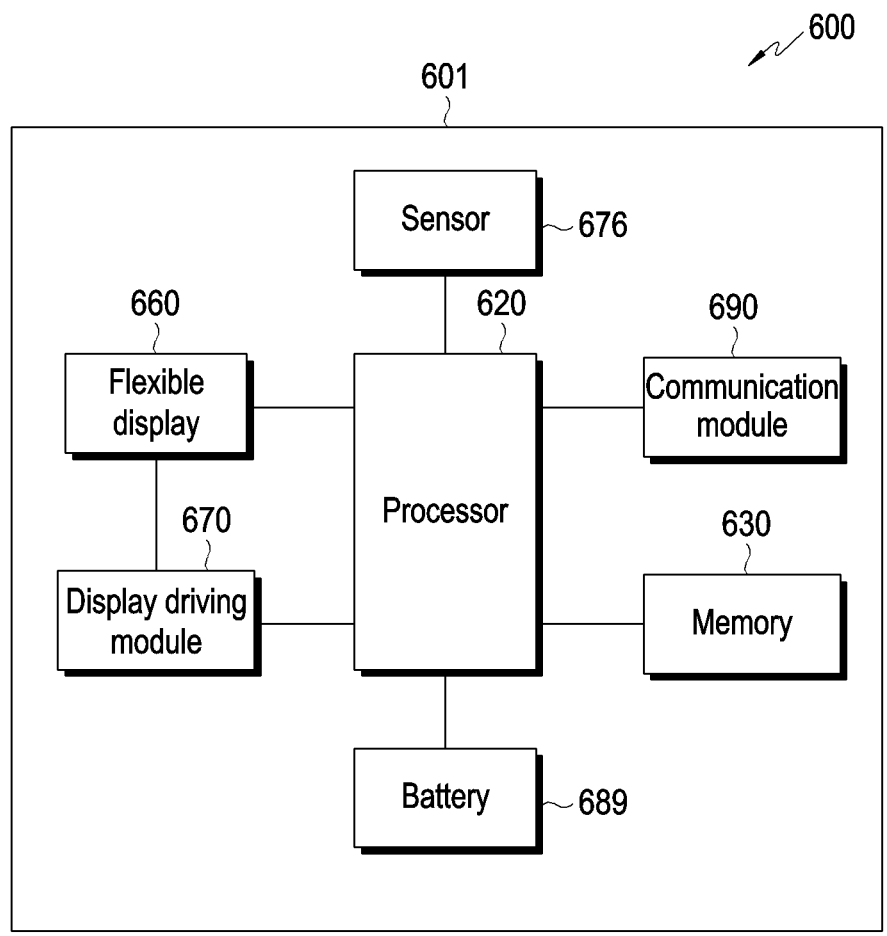
FIG. 6 is a block diagram illustrating an example configuration of an electronic device according to various embodiments.

FIG. 6 is a block diagram 600 illustrating an example configuration of an electronic device according to various embodiments.

Figure 17:
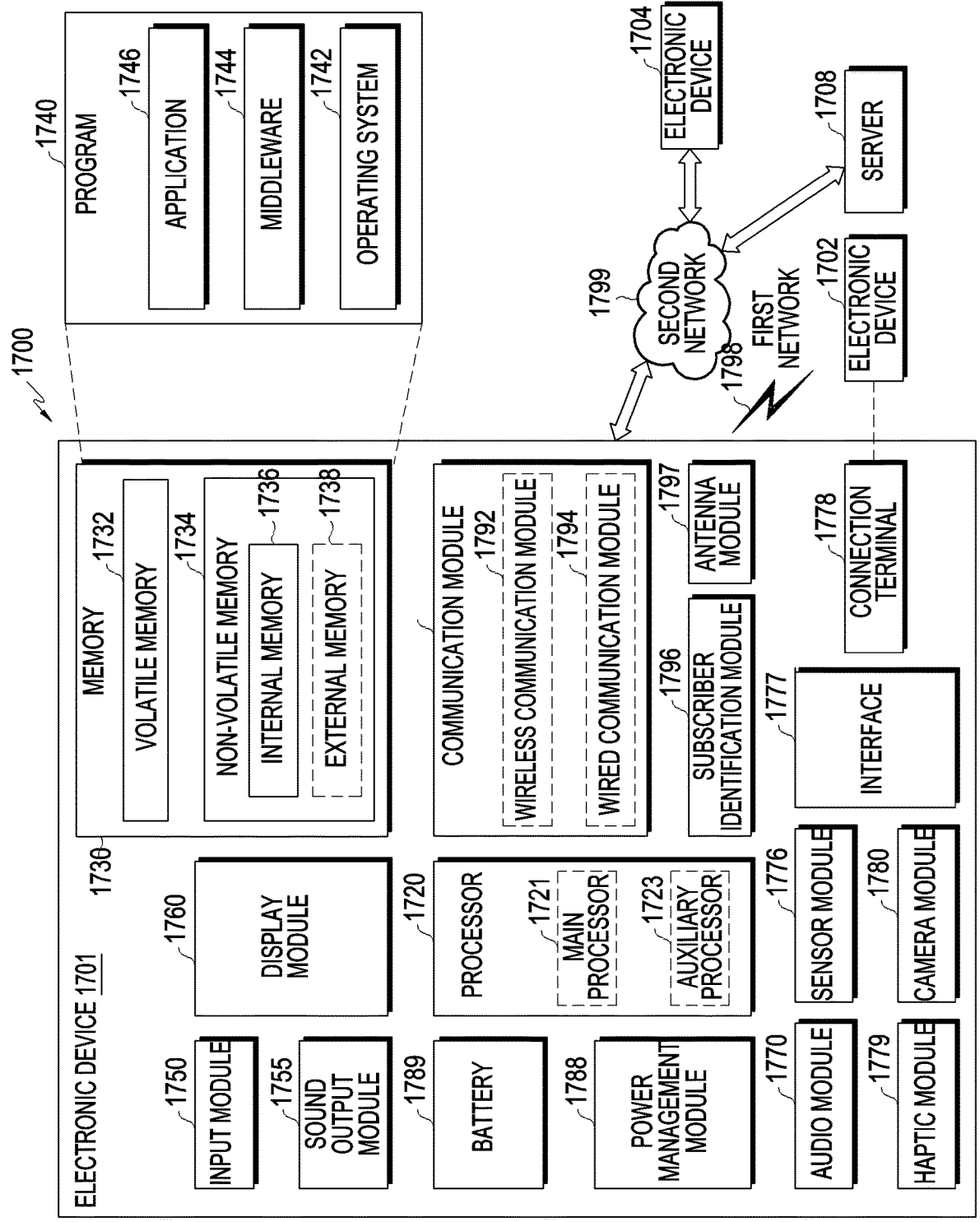
FIG. 17 is a block diagram illustrating an example electronic device in a network environment according to various embodiments.

Referring to FIG. 6, an electronic device 601 (e.g., the electronic device 100 in FIGS. 1 to 5C) may include a processor (e.g., including processing circuitry) 620 (e.g., the processor 1720 in FIG. 17), a memory 630 (e.g., the memory 1730 in FIG. 17), a flexible display 660 (e.g., the flexible display in FIGS. 1 to 5C or the display module 1760 in FIG. 17) including a first area A1 and a second area A2 that can be exposed to the outside of a housing (e.g., the second structure 102 in FIGS. 5A to 5C) of the electronic device or can be inserted into the housing according to the movement of a structure (e.g., the first structure in FIGS. 5A to 5C) of the electronic device, a display driving module (e.g., including display driving circuitry) 670, a sensor 676 (e.g., the sensor module 1776 in FIG. 17), a battery 689 (e.g., the battery 1789 in FIG. 17), and a communication module (e.g., including communication circuitry) 690 (e.g., the communication module 1790 in FIG. 17).

According to various embodiments, the processor 620 may include various processing circuitry and identify size information of an exposed area (or exposure area) of the flexible display 660 (hereinafter, a "display"), and display, on the display 660, information related to the available usage time of the electronic device 601 on the basis of the identified size information and the remaining amount of the battery 689. For example, the size information of the exposed area of the display 660 may include a predetermined exposed state of the display 660 (e.g., the first state in FIG. 5A, the second state in FIG. 5B, the third state in FIG. 5C, or a ratio of the exposed area to the entire size of the display 660) or length (or area) information of the exposed area of the display 660. For example, the length information of the exposed area of the display 660 may include pixel-related information (e.g., the physical or logical position of a pixel and the number of pixels) or information in a length unit (e g, millimeter (mm)) of the exposed area.

According to an embodiment, the processor 620 may identify size information of the exposed area of the display 660 using information received from the sensor 676.

According to an embodiment 620, the processor 620 may identify size information of the exposed area of the display 660 (e.g., the first state in FIG. 5A, the second state in FIG. 5B, the third state in FIG. 5C, or the length of the exposed area) and identify whether or not power state information of the electronic device 601 corresponds to a first condition. For example, the power state information may include at least one piece of information related to the remaining amount of the battery 689 and/or information related to the available usage time of the electronic device 601. Here, the remaining amount of the battery 689 may include the remaining power of the battery or the amount obtained by subtracting the amount of use of the battery from the amount of fully charged battery. If the power state information of the electronic device 601 corresponds to the first condition, the processor 620 may restrict movement of the structure (e.g., the first structure 101 in FIGS. 5A to 5C) and/or the display 660 to inhibit the size of the exposed area of the display 660 from being expanded, or display, on the display 660, guide information for reducing the size of the exposed area of the display 660.

According to an embodiment, the first condition may indicate that the remaining power of the battery 689 is equal to or less than a first threshold.

According to an embodiment, the first condition may indicate that the remaining power of the battery 689 is equal to or less than a first threshold in the state in which an external power source is not connected to the electronic device.

According to an embodiment, the first threshold may be a value to determine that the electronic device is in a low battery state, and may be changed by the processor 620 or a user. For example, the processor 620, based on the first threshold, may determine that the electronic device is in the low battery state when the battery power of the electronic device is 5% or when the battery power is 15% on the assumption that a fully charged power of the battery is 100%.

According to an embodiment, if it is identified that the remaining power of the battery 689 is equal to or less than the first threshold in a first state (e.g., the first state in FIG. 5A) in which only the first area A1 of the display 660 is exposed or in a second state (e.g., the second state in FIG. 5B) in which the first area A1 and a portion of the second area A2 of the display 660 are exposed, the processor 620 may display, on the display 660, notification information indicating that further expansion of the size of the exposed area of the display 660 is restricted because the electronic device is in the low battery state, and restrict movement of the second area A2 of the display 660 to be further exposed to the outside of the housing (e.g., the second structure 102 in FIGS. 5A to 5C) of the electronic device for further expansion of the size of the exposed area of the display 660.

For example, the restriction may include an operation in which the electronic device 601 inactivates a user interface (e.g., a physical button or a graphic user interface (GUI)) for moving the structure (e.g., the first structure 101 in FIGS. 5A to 5C) or an operation in which the electronic device 601 ignores a command for moving the structure, which is generated through the user interface. As another example, the restriction may include an operation in which the electronic device 601 provides the user with a user interface only capable of reducing the current size of the exposed area of the display 660. For example, when the electronic device 601 is in the second state in FIG. 5B, the electronic device 601 may provide a user interface (e.g., the GUI) capable of switching to the first state in FIG. 5A, and may not provide a user interface capable of switching to the third state in FIG. 5C or inactivate the user interface capable of switching to the third state.

According to an embodiment, if it is identified that the remaining power of the battery 689 is equal to or less than the first threshold in the first state (e.g., the first state in FIG. 5A) in which only the first area A1 of the display 660 is exposed, in the second state (e.g., the second state in FIG. 5B) in which the first area A1 and a portion of the second area A2 of the display 660 are exposed, or in the third state (e.g., the third state in FIG. 5C) in which the first area A1 and the entirety of the second area A2 of the display 660 are exposed, the processor 620 may display, on the display 660, guide information including at least one piece of battery saving information indicating size information of the exposed area of the display for battery saving or/and battery usage time information according to the size information of the exposed area of the display.

According to an embodiment, the processor 620 may produce a pop-up window and output the guide information to the produced pop-up window. The pop-up window may include at least one selectable user interface related to the guide information. For example, the processor 620 may include, in the pop-up window, at least one selectable user interface corresponding to each of the at least one piece of battery saving information included in the guide information. For example, the selectable user interface may include, but is not limited to, at least one of a radio button, a check box, a button image, and/or text representing battery saving information.

According to an embodiment, the processor 620 may receive a user input through at least one selectable user interface related to the guide information. For example, the user may select (or touch) a selectable user interface (e.g., a radio button) corresponding to at least one piece of battery saving information included in the guide information, which is being displayed on the display 660, thereby selecting one piece of battery saving information. The processor 620 may receive the user input and designate the battery saving information corresponding to the user input as first battery saving information.

According to an embodiment, the processor 620 may insert a portion or all of the second area A2 into the housing (e.g., the second structure 102 in FIGS. 5A to 5C) of the electronic device in the state in which the first area A1 of the display 660 is exposed on the basis of the size information of the exposed area of the display, which is included in the first battery saving information selected by the user from among the at least one piece of battery saving information included in the guide information, thereby reducing the size of the exposed area of the display 660 (e.g., the size of the exposed area corresponding to the first state in FIG. 5A, the second state in FIG. 5B, or the first battery saving information).

According to an embodiment, the processor 620 may display, on the display 660, at least one guide line for visually indicating the size information of the exposed area of the display, which is included in each of at least one piece of battery saving information included in the guide information. The processor 620 may display at least one guide line on the display 660 together with the guide information.

According to an embodiment, the processor 620 may insert a portion or all of the second area A2 into the housing (e.g., the second structure 102 in FIGS. 5A to 5C) of the device in the state in which the first area A1 of the display 660 is exposed on the basis of a first guide line selected by the user from among at least one guide line while displaying the at least one guide line for visually indicating the information on the exposed size of the display included in each of at least one piece of battery saving information, which is included in the guide information, thereby reducing the size of the exposed area of the display 660 (e.g., the size of the exposed area corresponding to the first state in FIG. 5A, the second state in FIG. 5B, or the first guide line).

According to various embodiments, the processor 620 may identify size information of the exposed area of the display 660 (e.g., the first state in FIG. 5A, the second state in FIG. 5B, or the third state in FIG. 5C), determine to turn off the power of the electronic device if the power state information of the electronic device 601 corresponds to a second condition, reduce the size of the exposed area of the display 660 to a default size, and then turn off the power of the electronic device.

According to an embodiment, if the power of the battery 689 corresponds to a second condition in the second state (e.g., the second state in FIG. 5B) in which a portion of the second area A2 of the display 660 is exposed to the outside of the second structure 102 while the first area A1 is exposed or in the third state (e.g., the third state in FIG. 5C) in which the entirety of the second area A2 of the display 660 is exposed to the outside of the second structure 102 while the first area A1 is exposed, the processor 620 may insert the entirety of the second area A2 of the display 660 into the housing (e.g., the second structure 102 in FIG. 5A) of the electronic device to reduce the size of the exposed area of the display 660 to a default size (e.g., the first state in FIG. 5A) and turn off the power of the electronic device.

According to an embodiment, the second condition may indicate that the remaining power of the battery 689 is equal to or less than a second threshold, or indicate an input to a power button of the electronic device.

According to an embodiment, the second threshold may be a value to determine that the battery power of the electronic device is in a discharged state, and may include a value smaller than the first threshold to determine that the battery power of the electronic device is in the low battery state. For example, the second threshold may be set to be smaller than the first threshold and greater than a power value capable of moving the structure (e.g., the first structure in FIGS. 5A to 5C) of the electronic device 601.

According to an embodiment, if it is identified that the remaining power of the battery 689 is equal to or less than the second threshold in the second state (e.g., the second state in FIG. 5B) in which the first area A1 and a portion of the second area A2 of the display 660 are exposed or in the third state (e.g., the third state in FIG. 5C) in which the first area A1 and the entirety of the second area A2 of the display 660 are exposed, the processor 620 may store the current size information of the exposed area of the display (e.g., the second state in FIG. 5B or the third state in FIG. 5C), and then turn off the power of the electronic device.

According to an embodiment, if an input to the power button of the electronic device for turning off the power of the electronic device is identified in the second state (e.g., the second state in FIG. 5B) in which the first area A1 and a portion of the second area A2 of the display 660 are exposed to the outside of the second structure 102 or in the third state (e.g., the third state in FIG. 5C) in which the first area A1 and the entirety of the second area A2 of the display 660 are exposed to the outside of the second structure 102, the processor 620 may insert the entirety of the second area A2 of the display 660 into the housing (e.g., the second structure 102 in FIG. 5A) of the electronic device (e.g., the first state in FIG. 5A) to reduce the size of the exposed area of the display 660 to a default size, and turn off the power of the electronic device.

According to an embodiment, if an input to the power button of the electronic device for turning off the power of the electronic device is identified in the second state (e.g., the second state in FIG. 5B) in which the first area A1 and a portion of the second area A2 of the display 660 are exposed or in the third state (e.g., the third state in FIG. 5C) in which the first area A1 and the entirety of the second area A2 of the display 660 are exposed, the processor 620 may enquire of the user about whether or not to store the current size information of the display, store the current size information of the exposed area of the display (e.g., the second state in FIG. 5B, the third state in FIG. 5C, or length information of the exposed area) if the user selects storing, and then turn off the power of the electronic device.

According to various embodiments, if it is identified that the power of the electronic device in the power-off state is turned on, the processor 620 may change the size information of the exposed area of the display on the basis of the size information of the exposed area of the display, which is stored before the electronic device is turned off.

According to an embodiment, if the power of the electronic device is turned on, the processor 620 may identify whether or not there is size information of the exposed area of the display, which is stored before the power of the electronic device is turned off. If there is size information of the exposed area of the display, and if the size information of the exposed area of the display indicates the second state (e.g., the second state in FIG. 5B) in which the first area A1 and a portion of the second area A2 of the display 660 are exposed or indicates the third state (e.g., the third state in FIG. 5C) in which the first area A1 and the entirety of the second area A2 of the display 660 are exposed, the processor 620 may move a portion or all of the second area A2 to be exposed to the outside of the housing (e.g., the second structure 102 in FIGS. 5A to 5C) of the electronic device, thereby changing the size of the exposed area of the display 660. Alternatively, if there is size information of the exposed area of the display 660, and if the size information of the exposed area of the display includes length information, the processor 620 may change the size of the exposed area of the display 660 to correspond to the length information containing the length of the exposed area of the display 660.

According to various embodiments, if a reduction in the size of the exposed area of the display is selected according to the guide information or guide line displayed on the display 660 in the case where the electronic device 601 includes two housings (second structures) slidable bilaterally, the processor 620 may sequentially move the two housings to slide according to the priority, thereby changing the size of the exposed area of the display, or simultaneously move the two housings to slide bilaterally, thereby changing the size of the exposed area of the display.

According to various embodiments, if the power state information of the electronic device corresponds to the first condition, the memory 630 may store guide information and guide line information for reducing the size information of the exposed area of the display 660.

According to an embodiment, the memory 630 may store the current size information of the exposed area of the display 630 before the power of the electronic device is turned off.

According to various embodiments, the display 660, as shown in FIGS. 5A to 5C, may include a first area A1 and a second area A2 extending from the first area A1, and move from the housing (e.g., the second structure 102 in FIGS. 5A to 5C) of the electronic device to be exposed to the front face of the electronic device 601 so that the size of the area is changed.

According to an embodiment, the first area A1 of the display 660 is exposed to the housing (e.g., the second structure 102 in FIGS. 5A to 5C) of the electronic device.

According to an embodiment, the second area A2 of the display 660 may be exposed to the outside of the housing (e.g., the second structure 102 in FIGS. 5A to 5C) or inserted into the housing depending on a change in the size of the exposed area of the display 660.

According to various embodiments, the display driving module 670 may expose the second area A2 of the display 660 to the outside of the housing (e.g., the second structure 102 in FIGS. 5A to 5C) of the electronic device or insert the same into the housing, for example, the display driving module 670 may include a drive motor.

According to an embodiment, in the case of including the rotatable roller 151 in FIGS. 5A to 5C and a motor for driving a gear capable of automatically moving the roller 151, the display driving module 670 may automatically move the second area A2 of the display 630 to be rolled up or slide, thereby changing the size of the display 660.

According to an embodiment, in the case of including the rotatable roller 151 in FIGS. 5A to 5C, the display driving module 670 may move the second area A2 of the display 660 to be rolled up or slide semi-automatically or manually by the user, thereby changing the size of the display 660.

According to an embodiment, in the case where the electronic device 601 includes two housings (e.g., second structures) slidable bilaterally, the display driving module 670 may include a plurality of rollers capable of driving the two housings to slide bilaterally.

According to various embodiments, the sensor 676 may identify size information of the exposed area of the display 660 according to the movement of the second area A2 of the display 660, and transmit the identified size information to the processor 620.

According to an embodiment, the sensor 676 may be disposed in a portion of the structure (e.g., the first structure 101 in FIGS. 5A to 5C) and/or the housing (e.g., the second structure 102 in FIGS. 5A to 5C), or may be disposed inside the structure to detect the movement state of the structure or the movement distance of the structure. The sensor 676 may include, for example, at least one of a Hall sensor and a distance sensor, but is not limited thereto. For example, the Hall sensor may be a magnetic sensor and detect a change in magnetism according to the movement of the structure (e.g., the first structure 101 in FIGS. 5A to 5C), thereby detecting a change in the state of the structure. As another example, the distance sensor may be at least one of an optical distance sensor, an ultrasonic distance sensor, and a radio wave distance sensor, and may be included in the structure detection sensor 150. For example, the distance sensor may include a time-of-flight (TOF) sensor that is an optical distance sensor. The TOF sensor may further include a light-emitting unit and measure the distance by measuring the time taken for the light emitted from the light-emitting unit to be reflected from another object and return back. Alternatively, the sensor 676 may include a touch sensor included in the display 660. For example, the electronic device 101 may detect the area where the display is exposed using a touch sensor included in the display 660.

According to an embodiment, although the sensor 676 is described as an element capable of detecting the movement state of the structure or the movement distance of the structure, the disclosure is not limited thereto. For example, the electronic device 101 may detect the movement of the structure using a change in the electrical signal due to a conductive circuit included in the rear surface of the display 660.

According to various embodiments, the battery 689 may store power to be supplied to at least one element of the electronic device 601.

According to various embodiments, the communication module 690 may include a plurality of communication circuits and include at least one of a wireless LAN module (not shown) and a short-range communication module (not shown), and the short-range communication module (not shown) may include a UWB communication module, a Wi-Fi communication module, a near field communication (NFC) module, a Bluetooth legacy communication module, and/or a Bluetooth low energy (BLE) communication module.

According to various example embodiments, an electronic device (e.g., the electronic device 100 in FIGS. 1 to 5C, the electronic device 601 in FIG. 6, or the electronic device 1700 in FIG. 17) may include: a housing (e.g., the second structure 101 in FIGS. 1 to 5C), a battery (e.g., the battery 689 in FIG. 6 or the battery 1789), a flexible display (e.g., the flexible display 103 in FIGS. 1 to 5C, the display 660 in FIG. 6, or the display module 1760 in FIG. 17) including a first area and a second area extending from the first area and configured to move from the housing to change a size of an area visible to the front face of the electronic device, a sensor (e.g., the sensor 676 in FIG. 6 or the sensor module 1776 in FIG. 17) configured to identify information related to the size of the visible area of the display, and a processor (e.g., the processor 620 in FIG. 6 or the processor 1720 in FIG. 17), wherein the processor may be configured to: identify size information of the visible area of the display using the information received from the sensor, and control the display to display information related to an available usage time of the electronic device based on the identified size information and a remaining amount of the battery.

According to various example embodiments, the processor may be configured to, based on power state information including the remaining amount of the battery of the electronic device corresponding to a first condition, restrict movement of the display to inhibit expansion of the size of the, visible area of the display, or display, on the display, guide information for reducing the size of the visible area of the display.

According to various example embodiments, the first condition may indicate that the remaining power of the battery is equal to or less than a first threshold.

According to various example embodiments, the first condition may indicate that the remaining power of the battery is equal to or less than a first threshold in a state in which an external power source is not connected to the electronic device.

According to various example embodiments, the electronic device may further include a display driving module comprising circuitry configured to move the display.

According to various example embodiments, the processor may be configured to, based on first battery saving information being selected from among at least one piece of battery saving information included in the guide information, move the second area to reduce the size of the visible area of the display based on size information of the visible area of the display, included in the first battery saving information.

According to various example embodiments, the processor may be configured to, based on a first guide line being selected from among at least one guide line while displaying the at least one guide line configured to visually indicate at least one piece of size information of the visible area of the display, included in the guide information, move the second area so that the visible area of the display to correspond to the first guide line, thereby reducing the size of the visible area of the display.

According to various example embodiments, the processor may be configured to, based on power state information of the electronic device corresponding to a second condition, insert the entirety of the second area into the housing to reduce the size of the visible area of the display and turn off the power of the electronic device.

According to various example embodiments, the second condition may indicate that the remaining power of the battery is equal to or less than a second threshold or indicate an input to a power button of the electronic device.

According to various example embodiments, the processor may be configured to store information on the visible size of the display before the power of the electronic device is turned off.

Figure 7:
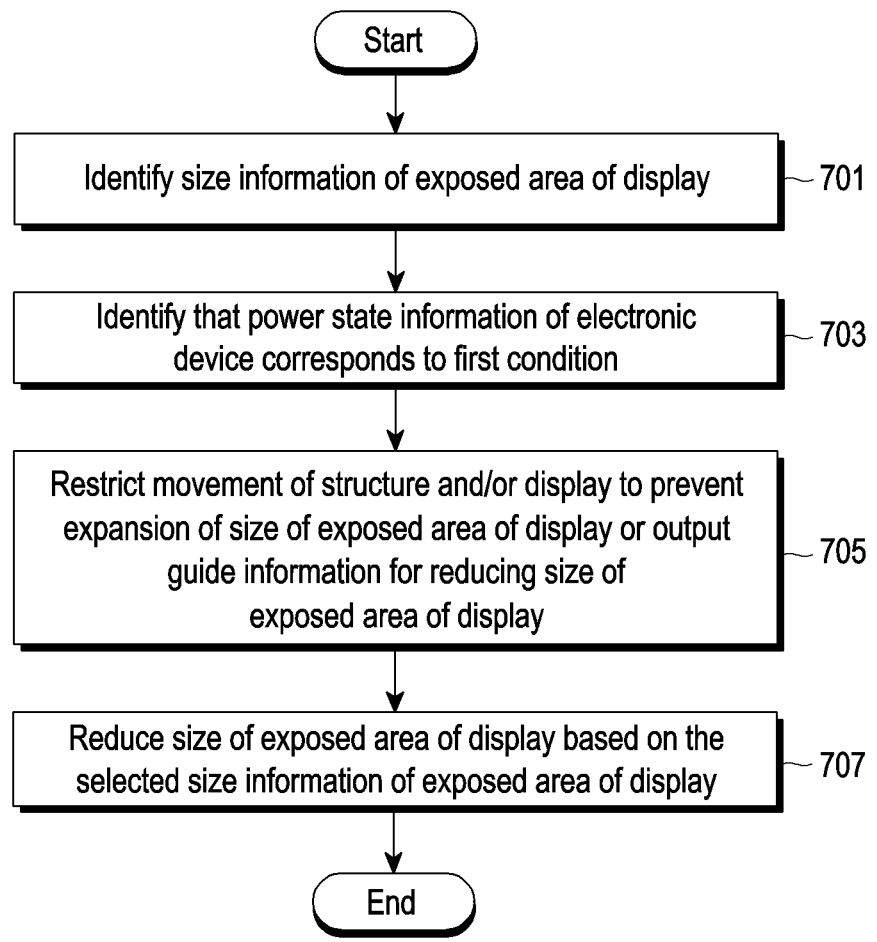
FIG. 7 is a flowchart illustrating an example operation of changing the size of an exposed area of a display based on power of a battery in an electronic device according to various embodiments.

FIG. 7 is a flowchart illustrating an example operation of changing the size of an exposed area of a display based on power of a battery in an electronic device according to various embodiments. The operation of changing the size of the exposed area of the display may include, for example, operations 701, 703, 705 and 707 (which may be referred to hereinafter as operations 701 to 707). According to an embodiment, at least one of operations 701 to 707 may be omitted, the sequence of some operations may be changed, or other operations may be added thereto. Operations 701 to 707 may be conducted by, for example, an element (e.g., the processor 620 in FIG. 6) of an electronic device (e.g., the electronic device 100 in FIGS. 1 to 5C or the electronic device 601 in FIG. 6).

In operation 701, the electronic device (e.g., the electronic device 100 in FIGS. 1 to 5C or the electronic device 601 in FIG. 6) may identify size information of the exposed (e.g., visible) area of the display (e.g., the display 103 in FIGS. 5A to 5C or the display 660 in FIG. 6). As used herein with reference to the display size, the term "exposed" may be used interchangeably with the term "visible".

According to an embodiment, the electronic device may identify size information of the exposed (e.g., visible) area of the display using the information received from the sensor (e.g., the sensor 676 in FIG. 6 or the electronic device 1701 in FIG. 17).

According to an embodiment, the electronic device may identify the second state (e.g., the second state in FIG. 5B) in which the first area A1 of the display is exposed and in which a portion of the second area A2 of the display is exposed to the outside of the housing of the electronic device using the information received from the sensor.

According to an embodiment, the electronic device may identify the third state (e.g., the third state in FIG. 5C) in which the first area A1 of the display is exposed and in which the entirety of the second area A2 of the display is exposed to the outside of the housing (e.g., the second structure 102 in FIGS. 5A to 5C) of the electronic device using the information received from the sensor 676.

According to an embodiment, the electronic device may identify length information of the exposed area of the display using the information received from the sensor.

In operation 703, the electronic device (e.g., the electronic device 100 in FIGS. 1 to 5C or the electronic device 601 in FIG. 6) may identify that power state information of the electronic device corresponds to a first condition.

According to an embodiment, the first condition may indicate that the remaining power of the battery (e.g., the battery 689 in FIG. 6) is equal to or less than a first threshold, or indicate that the remaining power of the battery is equal to or less than the first threshold in the state in which the external power source is not connected to the electronic device.

According to an embodiment, the electronic device may compare the power stored in the battery (e.g., the battery 689 in FIG. 6) of the electronic device with the first threshold, and, if the power of the battery is equal to or less than the first threshold for determining a low battery state, determine that the electronic device is in the low battery state.

In operation 705, the electronic device (e.g., the electronic device 100 in FIGS. 1 to 5C or the electronic device 601 in FIG. 6) may restrict movement of the structure (e.g., the first structure 101 in FIGS. 5A to 5C) and/or the display to inhibit expansion of the size of the exposed area of the display (e.g., the display 103 in FIGS. 1 to 5C or the display 660 in FIG. 6), or may output guide information for reducing the size of the exposed area of the display.

According to an embodiment, the electronic device may display, on the display, notification information indicating that further expansion of the size of the exposed area of the display is restricted because the electronic device is in the low battery state, and restrict movement of the second area A2 of the display to be exposed to the outside of the housing (e.g., the second structure 102 in FIGS. 5A to 5C) of the electronic device for further expansion of the size of the exposed area of the display.

According to an embodiment, the guide information may include at least one piece of battery saving information, and the battery saving information may include size information of the exposed area of the display for battery saving and battery usage time information according to the size information of the exposed area of the display. The guide information may be included in a pop-up window to be displayed.

According to an embodiment, the electronic device may further display, on the display, at least one guide line for visually indicating the size information of the exposed area of the display included in each of at least one piece of battery power information included in the guide information together with guide information.

According to an embodiment, restricting the movement of the display may include an operation in which the electronic device inactivates a user interface (e.g., a physical button or a graphic user interface (GUI)) for moving the structure (e.g., the first structure 101 in FIGS. 5A to 5C) or an operation in which the electronic device 601 ignores a command for moving the structure, which is generated through the user interface.

According to an embodiment, restricting the movement of the display may include an operation in which the electronic device 601 provides the user with a user interface only capable of reducing the current size of the exposed area of the display. For example, when the electronic device 601 is in the second state in FIG. 5B, the electronic device 601 may provide a user interface (e.g., the GUI) capable of switching to the first state in FIG. 5A, and may not provide a user interface capable of switching to the third state in FIG. 5C or inactivate the user interface capable of switching to the third state.

In operation 707, the electronic device (e.g., the electronic device 100 in FIGS. 1 to 5C or the electronic device 601 in FIG. 6) may reduce the size of the exposed area of the display (e.g., the display 103 in FIGS. 1 to 5C or the display 660 in FIG. 6) based on the selected size information of the exposed area of the display.

According to an embodiment, the electronic device may display a pop-up window including at least one selectable user interface corresponding to each of at least one piece of battery saving information included in the guide information, and may designate, as first battery saving information, battery information that corresponds to the selectable user interface having received a user input, among the at least one selectable user interface. The electronic device may reduce the size of the exposed area of the display to correspond to the size information of the exposed area of the display, which is included in the first battery saving information selected by the user.

According to an embodiment, the electronic device may display at least one guide line being displayed with guide information on the display, designate the guide line receiving the user input, among the at least one guide line, as a first guide line, and reduce the size of the exposed area of the display on the basis of the size information of the exposed area of the display corresponding to the first guide line.

According to an embodiment, the electronic device may reduce the size of the exposed area of the display to a value corresponding to the second state (e.g., the second state in FIG. 5B) in which a portion of the second area A2 of the display is inserted into the housing (e.g., the second structure 102 in FIGS. 5A to 5C) of the electronic device so as to correspond to the selected size information of the exposed area of the display.

According to an embodiment, the electronic device may reduce the size of the exposed area of the display to a value corresponding to the third state (e.g., the third state in FIG. 5C) in which the entirety of the second area A2 of the display is inserted into the housing (e.g., the second structure 102 in FIG. 5C) of the electronic device so as to correspond to the selected size information of the exposed area of the display.

According to an embodiment, the electronic device may reduce the size (e.g., the length or area) of the exposed area of the display to correspond to the selected size information of the exposed area of the display.

Figure 8A:
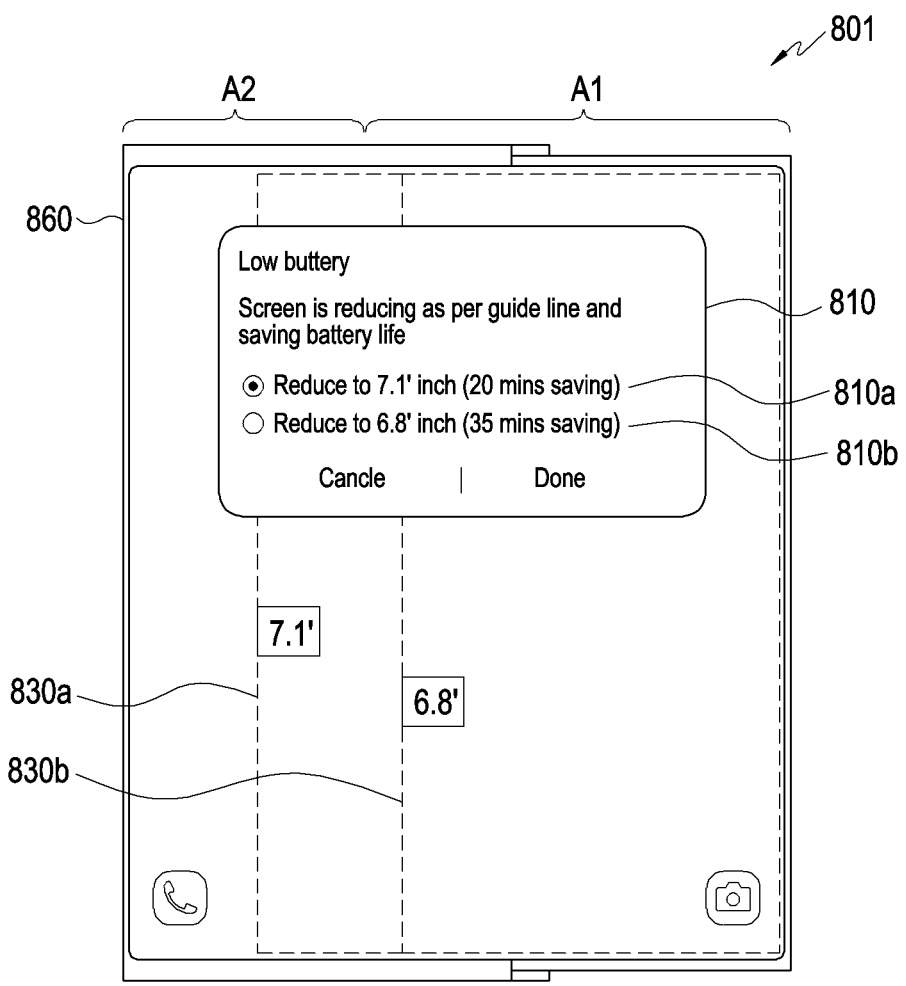
FIGS. 8A, 8B, and 8C are diagrams illustrating an example operation of changing the size of an exposed area of a display based on power of a battery in a standby mode of an electronic device according to various embodiments.
Figure 8B:
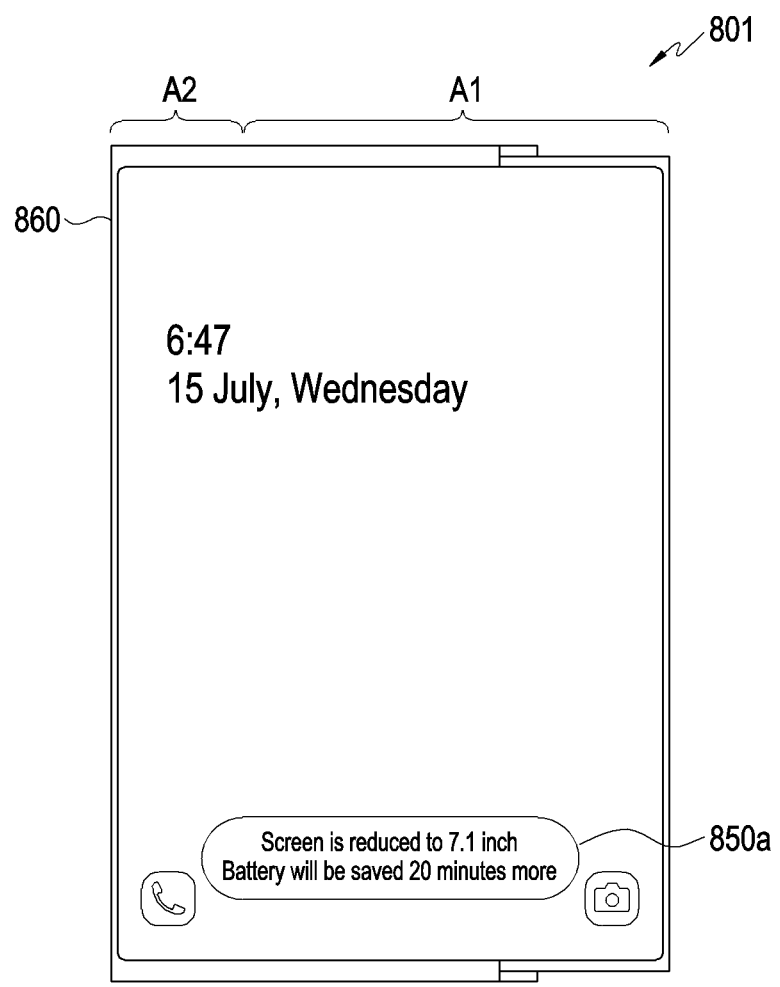
Figure 8C:
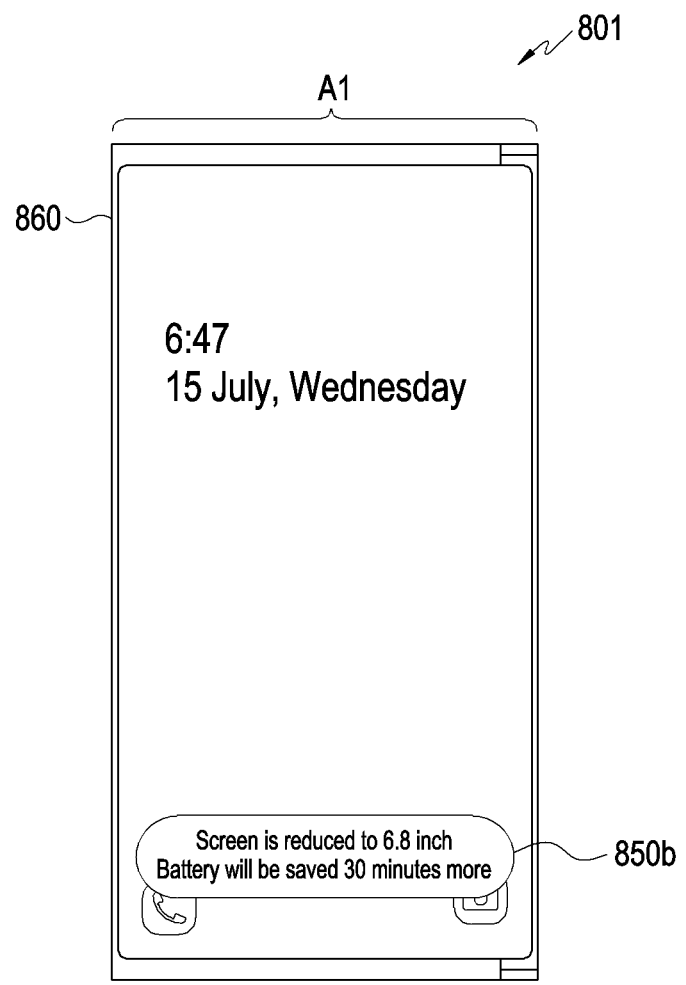

FIGS. 8A, 8B and 8C are diagrams illustrating an example operation of changing the size of an exposed area of a display based on power of a battery in a standby mode of an electronic device according to various embodiments.

Referring to FIG. 8A, if it is identified that of an electronic device is in a low battery state in which the power of the battery thereof is equal to or less than a first threshold in the state (e.g., the third state in FIG. 5C) in which the entirety of a second area A2 of a display 860 (e.g., the display 103 in FIGS. 1 to 5C or the display 660 in FIG. 6) is exposed to the outside of the housing (e.g., the second structure 102 in FIG. 5C) of the electronic device, the electronic device 801 (e.g., the electronic device 100 in FIGS. 1 to 5C or the electronic device 601 in FIG. 6) may display, on the display 860, a pop-up window 810 including guide information, and a plurality of guide lines 830*a* and 830*b*. The electronic device may include, in the pop-up window 810, a plurality of selectable user interfaces 810*a* and 810*b* respectively corresponding to the plurality of pieces of battery saving information included in the guide information. A first selectable user interface 810*a* corresponding to first battery saving information among the plurality of selectable user interfaces may indicate size information (e.g., 7.1 inches) of the exposed area of the display for battery saving and battery usage time information (e.g., usage time of 20 minutes) according to the size information of the exposed area of the display. A second selectable user interface 810*b* corresponding to second battery saving information among the plurality of selectable user interfaces may indicate size information (e.g., 6.8 inches) of the exposed area of the display for battery saving and battery usage time information (e.g., usage time of 35 minutes) according to the size information of the exposed area of the display.

The electronic device 801 may display a first guide line 830*a* visually indicating size information (e.g., 7.1 inches) of the exposed area of the display of the first battery saving corresponding to the first selectable user interface 810*a* included in the pop-up window 810, and a second guide line 830*b* visually indicating size information (e.g., 6.8 inches) of the exposed area of the display of the second battery saving information corresponding to the second selectable user interface 810*b* included in the pop-up window 810.

If a user input is received through the first selectable user interface corresponding to the first battery saving information in the pop-up window 810, or if a user input is received through the first guide line 830*a* among the plurality of guide lines, as shown in FIG. 8B, the electronic device 801 may switch to the second state (e.g., the second state in FIG. 5B) in which a portion of the second area A2 of the display 860 is inserted into the housing (e.g., the second structure 102 in FIG. 5C) of the electronic device, thereby reducing the size of the exposed area of the display 860. If the display 860 switches to the second state so that the size of the exposed area of the display 860 is reduced, the electronic device 801 may provide battery usage time information (e.g., usage time of 20 minutes) to the pop-up window 850*a*.

If a user input is received through the second selectable user interface 810*b* corresponding to the second battery saving information in the pop-up window 810, or if a user input is received through the second guide line 830*b* among the plurality of guide lines, as shown in FIG. 8C, the electronic device 801 may switch to the first state (e.g., the first state in FIG. 5A) in which the entirety of the second area A2 of the display 860 is inserted into the housing (e.g., the second structure 102 in FIG. 5A) of the electronic device, thereby reducing the size of the exposed area of the display 860. If the display 860 switches to the first state so that the size of the exposed area of the display 860 is reduced, the electronic device 801 may provide battery usage time information (e.g., usage time of 35 minutes) to the pop-up window 850*b*.

In addition, as shown in FIG. 8B, in the second state (e.g., the second state in FIG. 5B) in which a portion of the second area A2 of the display 860 is inserted into the housing (e.g., the second structure 102 in FIGS. 5A to 5C) of the electronic device, the electronic device 801 may identify that the electronic device is in the low battery state in which the power of the battery is equal to or less than a first threshold while using the electronic device. If it is identified that the electronic device is in the low battery state in which the power of the battery is equal to or less than a first threshold, the electronic device may provide the display 860 with a pop-up window including a second selectable user interface (e.g., the second selectable user interface 810*b* in FIG. 8A) corresponding to second battery saving information, and a second guide line (e.g., the second guide line 830*b* in FIG. 8A). If a user input is received through the second selectable user interface corresponding to the second battery saving information, or if a user input is received through the second guide line, as shown in FIG. 8C, the electronic device may switch to the first state (e.g., the first state in FIG. 5A) in which the entirety of the second area A2 of the display 860 is inserted into the housing (e.g., the second structure 102 in FIG. 5A) of the electronic device, thereby reducing the size of the exposed area of the display 860.

Figure 9A:
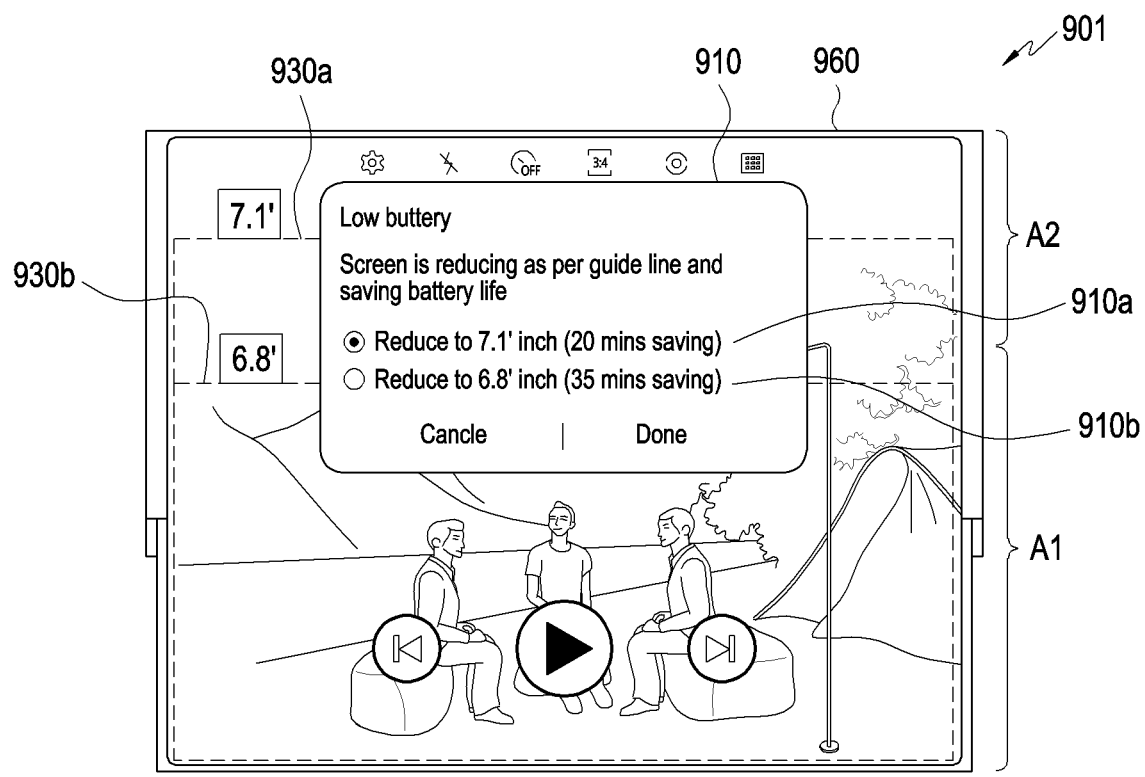
FIGS. 9A, 9B and 9C are diagrams illustrating an example operation of changing the size of an exposed area of a display based on power of a battery while a moving picture is reproduced in an electronic device according to various embodiments.
Figure 9B:
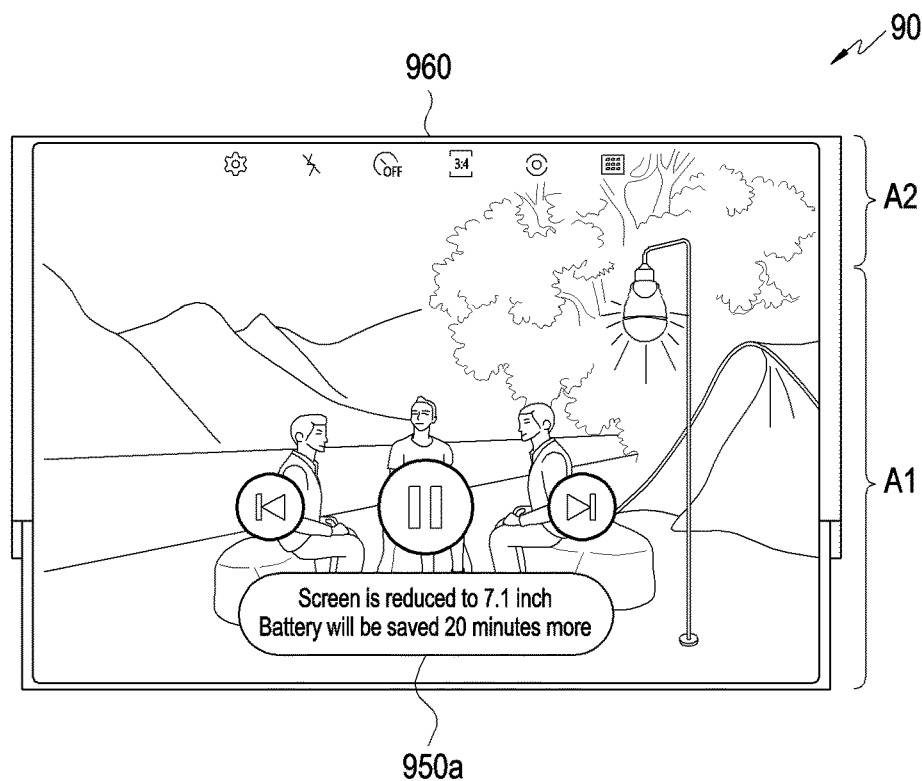
Figure 9C:
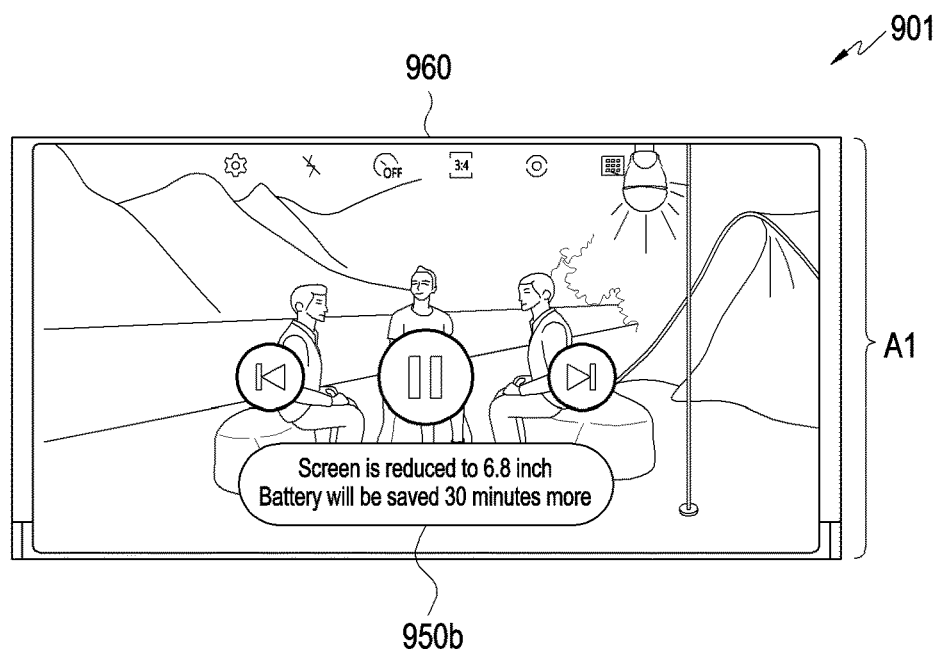

FIGS. 9A, 9B and 9C are diagrams illustrating an example operation of changing the size of an exposed area of a display based on power of a battery while a moving picture is reproduced in an electronic device according to various embodiments.

Referring to FIG. 9A, if it is identified that the electronic device is in the low battery state in which the power of the battery is less than or equal to a first threshold while reproducing a moving picture in the third state (e.g., the third state in FIG. 5C) in which the entirety of a second area A2 of a display 960 (e.g., the display 103 in FIGS. 1 to 5C or the display 660 in FIG. 6) is exposed to the outside of a housing (e.g., the second structure 102 in FIG. 5C) of the electronic device, the electronic device 910 (e.g., the electronic device 100 in FIGS. 1 to 5C or the electronic device 601 in FIG. 6) may stop reproducing the moving picture, and display, on the display 960, a pop-up window 910 including guide information, and a plurality of guide lines 930*a* and 930*b*. The pop-up window 910 may include a plurality of selectable user interfaces 910*a* and 910*b* corresponding to a plurality of pieces of battery saving information, and a first selectable user interface 910*a* corresponding to first battery saving information, among the plurality of selectable user interfaces, may include size information (e.g., 7.1 inches) of the exposed area of the display for battery saving and usage time information (e.g., usage time of 20 minutes) according to the size information of the exposed area of the display. A second selectable user interface 910*b* corresponding to second battery saving information, among the plurality of selectable user interfaces, may include size information (e.g., 6.8 inches) of the exposed area of the display for battery saving and usage time information (e.g., usage time of 35 minutes) according to the size information of the exposed area of the display.

The electronic device 901 may display a first guide line 930*a* visually indicating the size information (e.g., 7.1 inches) of the exposed area of the display of the first battery saving information corresponding to the first selectable user interface 910*a* included in the pop-up window 910, and a second guide line 930*b* visually indicating the size information (e.g., 6.8 inches) of the exposed area of the display of the second battery saving information corresponding to the second selectable user interface included in the pop-up windows 910.

If a user input is received through the first selectable user interface 910*a* corresponding to the first battery saving information in the pop-up window 910, or if a user input is received through the first guide line 930*a* among the plurality of guide lines, as shown in FIG. 9B, the electronic device 901 may switch to the second state (e.g., the second state in FIG. 5B) in which a portion of the second area A2 of the display 960 is inserted into the housing (e.g., the second structure 102 in FIG. 5C) of the electronic device, thereby reducing the size of the exposed area of the display 960. If the display 960 switches to the second state so that the size of the exposed area of the display 960 is reduced, the electronic device 901 may provide battery usage time information (e.g., usage time of 20 minutes) to the pop-up window 950*a*. The electronic device 901 may start reproducing the moving picture in the second state in which the size of the exposed area of the display 960 is reduced.

If a user input is received through the second selectable user interface 910*b* corresponding to the second battery saving information in the pop-up window 910, or if a user input is received through the second guide line 930*b* among the plurality of guide lines, as shown in FIG. 9C, the electronic device 901 may switch to the first state (e.g., the first state in FIG. 5A) in which the entirety of the second area A2 of the display 960 is inserted into the housing (e.g., the second structure 102 in FIG. 5A) of the electronic device, thereby reducing the size of the exposed area of the display 960. If the display 960 switches to the first state so that the size of the exposed area of the display 960 is reduced, the electronic device 901 may provide battery usage time information (e.g., usage time of 35 minutes) in the first state to the pop-up window 950*b*. The electronic device 901 may start reproducing the moving picture in the first state in which the size of the exposed area of the display 960 is reduced.

In addition, as shown in FIG. 9B, in the second state (e.g., the second state in FIG. 5B) in which a portion of the second area A2 of the display 960 is inserted into the housing (e.g., the second structure 102 in FIGS. 5A to 5C) of the electronic device, the electronic device 901 may identify that the electronic device is in the low battery state in which the power of the battery is less than or equal to a first threshold while reproducing a moving picture. If it is identified that the electronic device is in the low battery state in which the power of the battery is equal to or less than the first threshold, the electronic device may stop reproducing the moving picture, and provide the display 960 with a pop-up window including a second selectable user interface (e.g., the second selectable user interface 910*b* in FIG. 9I) corresponding to second battery saving information, and a second guide line (e.g., the guide line 930*b* in FIG. 9A). If a user input is received through the second selectable user interface corresponding to the second battery saving information, or if a user input is received through the second guide line, as shown FIG. 9C, the electronic device 901 may switch to the first state (e.g., the first state in FIG. 5A) in which the entirety of the second area A2 of the display 960 is inserted into the housing (e.g., the second structure 102 in FIG. 5C) of the electronic device, thereby reducing the size of the exposed area of the display 960. The electronic device 901 may start reproducing the moving picture in the first state in which the size of the exposed area of the display 960 is reduced.

Figure 10A:
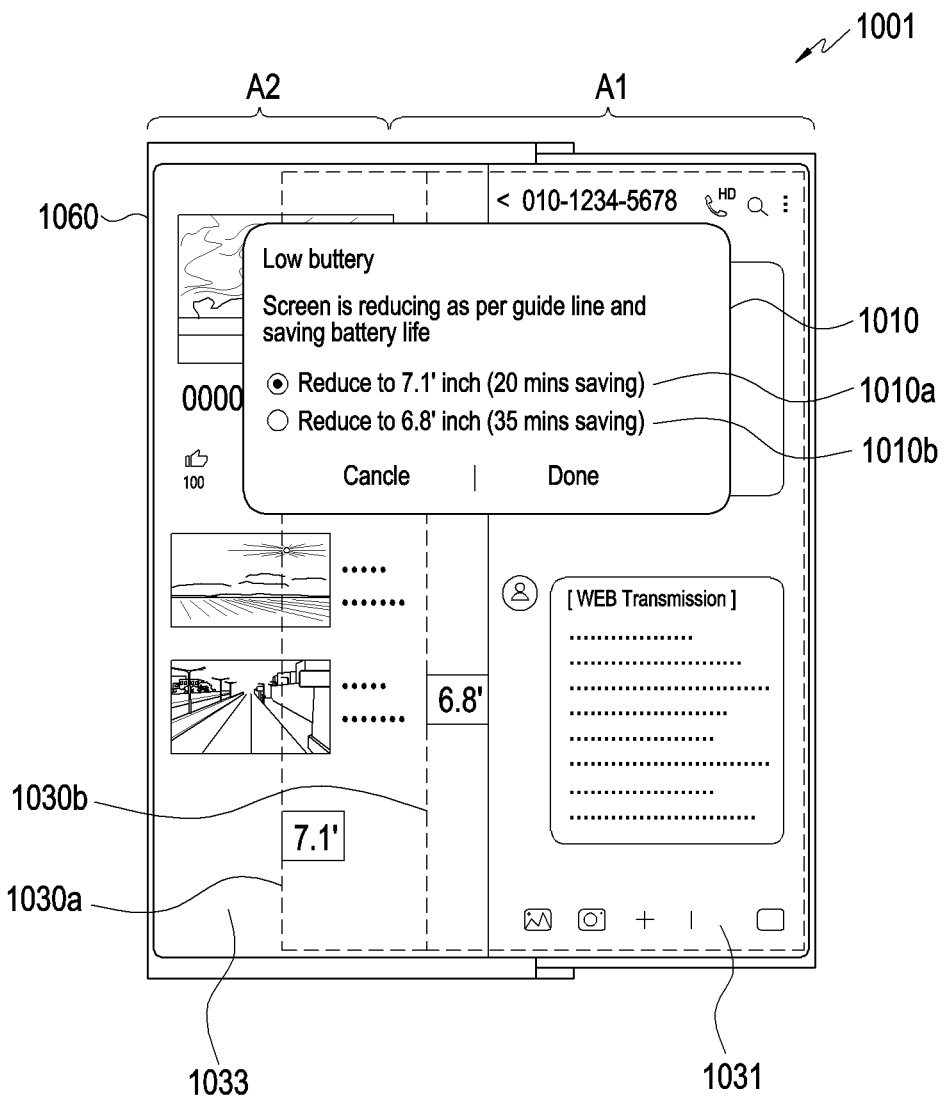
FIGS. 10A, 10B and 10C are diagrams illustrating an example operation of changing the size of an exposed area of a display based on power of a battery while a plurality of applications are executed in an electronic device according to various embodiments.
Figure 10B:
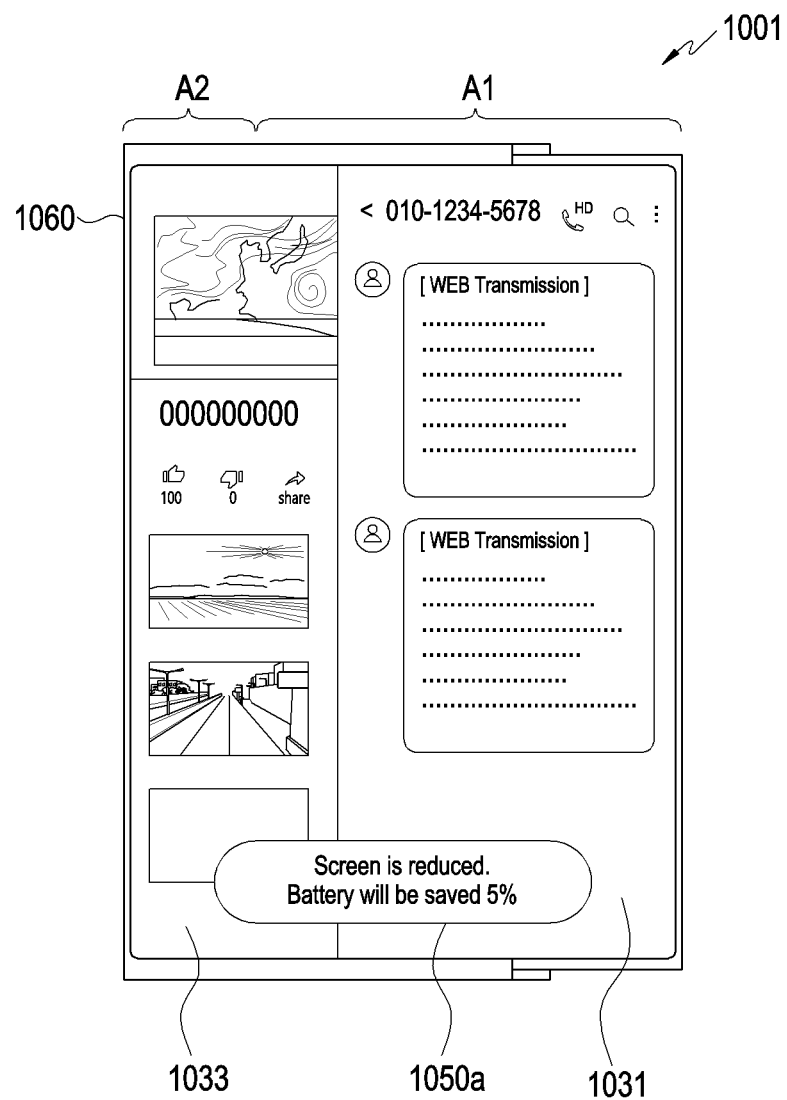
Figure 10C:
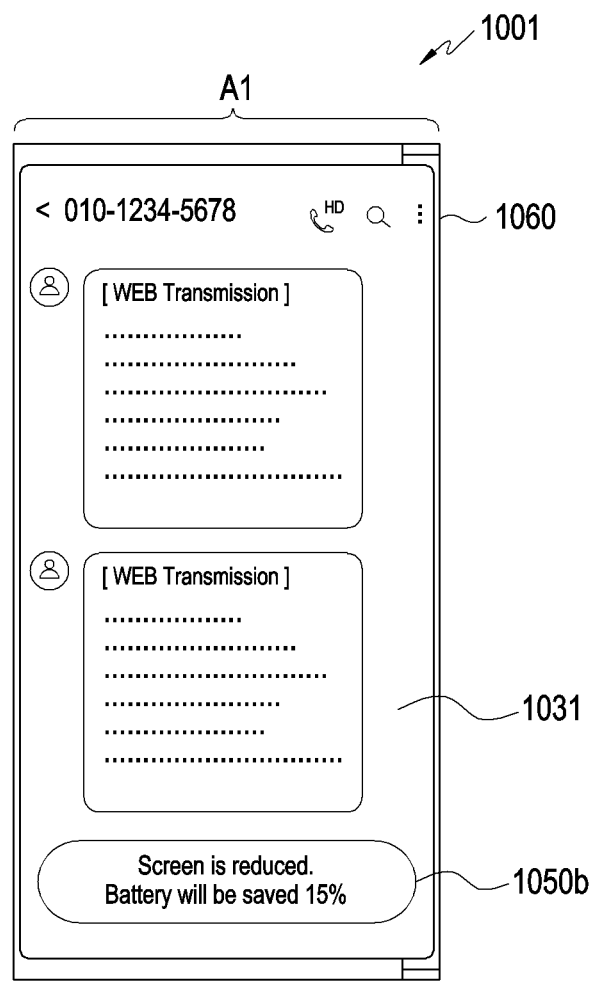

FIGS. 10A, 10B and 10C are diagrams illustrating an example operation of changing the size of an exposed area of a display based on power of a battery while a plurality of applications is executed in an electronic device according to various embodiments.

Referring to FIG. 10A, an electronic device 1001 (e.g., the electronic device 100 in FIGS. 1 to 5C or the electronic device 601 in FIG. 6), in the third state (e.g., the third state in FIG. 5C) in which the entirety of the second area A2 of a display 1060 (e.g., the display 103 in FIGS. 1 to 5C or the display 660 in FIG. 6) is exposed to the outside of a housing (e.g., the second structure 102 in FIG. 5C) of the electronic device, may identify that the electronic device is in the low battery state in which the power of a battery is less than or equal to a first threshold while displaying the execution screen of a first application 1031 focused by a user's touch input, among a plurality of applications 1031 and 1033 being executed in the electronic device, as a foreground (or on the top layer of the screen) and while displaying the execution screen of a second application 1033 as a background (or on the layer below the top layer of the screen).

If it is identified that the electronic device is in the low battery state in which the power of the battery is less than or equal to the first threshold, the electronic device 1001 may display a pop-up window 1010 including guide information, and a plurality of guide lines 1030a and 1030b on the display 1060. The pop-up window 1010 may include a plurality of selectable user interfaces 1010a and 1010b corresponding to a plurality of pieces of battery saving information, and a first selectable user interface 1010a corresponding to first battery saving information, among the plurality of selectable user interfaces, may include size information (e.g., 7.1 inches) of the exposed area of the display for battery saving and battery usage time information (e.g., usage time of 20 minutes) according to the size information of the exposed area of the display. A second selectable user interface 1010b corresponding to second battery saving information, among the plurality of selectable user interfaces, may include size information (e.g., 6.8 inches) of the exposed area of the display for battery saving and battery usage time information (e.g., usage time of 35 minutes) according to the size information of the exposed area of the display.

The electronic device 1001 may display a first guide line 1030a visually indicating the size information (e.g., 7.1 inches) of the exposed area of the display of the first battery saving information corresponding to the first selectable user interface 1010a included in the pop-up window 1010, and a second guide line 1030b visually indicating the size information (e.g., 6.8 inches) of the exposed area of the display of the second battery saving information corresponding to the second selectable user interface 1010b included in the pop-up window 1010.

If a user input is received through the first selectable user interface 1010a corresponding to first battery saving information in the pop-up window 1010, or if a user input is received through the first guide line 1030a among the plurality of guide lines, as shown in FIG. 10B, the electronic device 1001 may switch to the second state (e.g., the second state in FIG. 5B) in which a portion of the second area A2 of the display 1060 is inserted into the housing (e.g., second structure 102 in FIG. 5C) of the electronic device, thereby reducing the size of the exposed area of the display 1060. If the display 1060 switches to the second state so that the size of the exposed area of the display 1060 is reduced, the electronic device 1001 may provide battery usage time information (e.g., usage time of 20 minutes) to the pop-up window 1050A. According to a user's touch input to the execution screen of the second application 1033 while displaying the execution screen of the first application 1031 currently focused as a foreground while maintaining the size thereof in the second state in which the size of the exposed area of the display 1060 is reduced and displaying the execution screen of the second application 1033 as a background on the display 1060, the electronic device 1060 may display the execution screen of the second application 1033 currently focused as a foreground and display the execution screen of the first application 1031 as a background on the display 1060. For example, the screen layer including the execution screen of the second application 1033 may be changed to the top layer, and the screen layer including the execution screen of the first application 1031 may be changed to the lower layer.

If a user input is received through the second selectable user interface 1010b corresponding to second battery saving information in the pop-up window 1010, or if a user input is received through the second guide line 1030b among the plurality of guide lines, as shown in FIG. 10C, the electronic device 1001 may switch to the first state (e.g., the first state in FIG. 5A) in which the entirety of the second area A2 of the display 1060 is inserted into the housing (e.g., the second structure 102 in FIG. 5A) of the electronic device, thereby reducing the size of the exposed area of the display 1060. If the display 1060 switches to the first state so that the size of the exposed area of the display 1060 is reduced, the electronic device 1001 may provide battery usage time information (e.g., usage time of 35 minutes) to the pop-up window 1050b.

According to a touch input (e.g., dragging) to a bezel area while displaying the execution screen of the first application 1031 currently focused as a foreground (or on the top layer of the screen) and displaying the execution screen of the second application 1033 as a background (or on the layer lower than the top layer of the screen) on the display 1060 in the first state in which the size of exposed area of the display 1060 is reduced, the electronic device 1060 may display the execution screen of the second application 1033 currently focused as a foreground (or on the top layer of the screen) and display the execution screen of the first application 1031 as a background (or on the layer lower than the top layer of the screen) on the display 1060.

In addition, as shown in FIG. 10B, the electronic device 1001 may identify that the electronic device is in the low battery state in which the power of the battery is less than or equal to a first threshold while displaying the execution of a plurality of applications in the second state (e.g., the second state in FIG. 5B) in which a portion of the second area A2 of the display 1060 is inserted into the housing (e.g., the second structure 102 in FIGS. 5A to 5C) of the electronic device. If it is identified that the electronic device is in the low battery state in which the power of the battery is equal to or less than the first threshold, the electronic device may provide the display 1060 with a pop-up window including the second selectable user interface (e.g., the second selectable user interface 1010b in FIG. 10A) corresponding to second battery saving information and a second guide line (e.g., the second guide line 1030b in FIG. 10A), and if a user input is received through the second selectable user interface corresponding to the second battery saving information, or if a user input is received through the second guide line, as shown in FIG. 10C, the electronic device may switch to the first state (e.g., the first state in FIG. 5A) in which the entirety of the second area A2 of the display 1060 is inserted into the housing (e.g., the second structure 102 in FIG. 5A) of the electronic device, thereby reducing the size of the exposed area of the display 1060.

Figure 11:
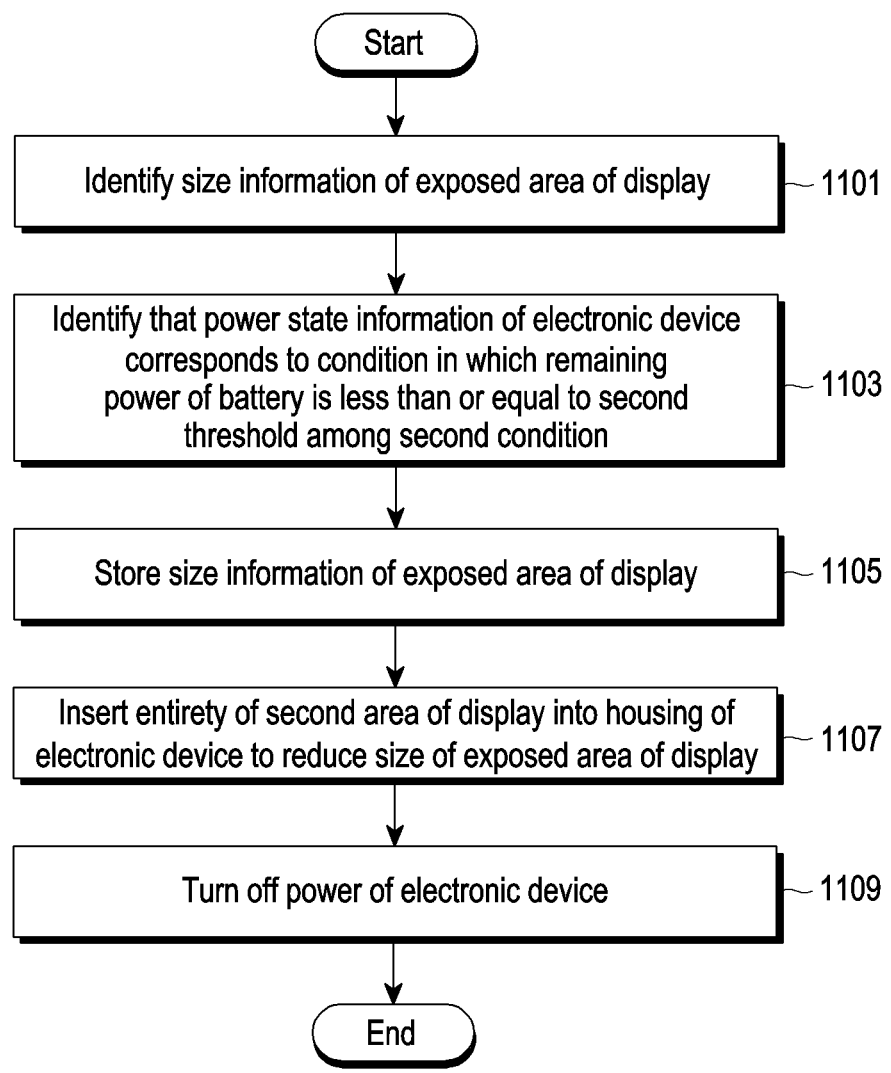
FIG. 11 is a flowchart illustrating an example operation of changing the size of an exposed area of a display based on turning off the power of an electronic device according to various embodiments.

FIG. 11 is a flowchart illustrating an example operation of changing the size of an exposed area of a display according to turning off the power of an electronic device according to various embodiments. The operation of changing the size of the exposed area of the display may include operations 1101, 1103, 1105, 1107 and 1109 (which may be referred to hereinafter as operations 1101 to 1109). According to an embodiment, at least one of operations 1101 to 1109 may be omitted, the sequence of some operations may be changed, or other operations may be added thereto. Operations 1101 to 1109 may be conducted by, for example, an element (e.g., the processor 620 in FIG. 6) of an electronic device (e.g., the electronic device 100 in FIGS. 1 to 5C, the electronic device 601 in FIG. 6, or the electronic device 1701 in FIG. 17).

In operation 1101, an electronic device (e.g., the electronic device 100 in FIGS. 1 to 5C or the electronic device 601 in FIG. 6) may identify size information of the exposed (e.g., visible) area of a display (e.g., the display 103 in FIGS. 5A to 5C or the display 660 in FIG. 6).

According to an embodiment, the electronic device may identify the size information of the exposed area of the display using information received from a sensor (e.g., the sensor 676 in FIG. 6).

According to an embodiment, the electronic device, using the information received from the sensor, may identify the second state (e.g., the second state in FIG. 5B) in which the first area A1 of the display is exposed and in which a portion of the second area A2 of the display is exposed to the outside of the housing of the electronic device.

According to an embodiment, the electronic device, using the information received from the sensor 676, may identify the third state (e.g., the third state in FIG. 5C) in which the first area A1 of the display is exposed and in which the entirety of the second area A2 of the display is exposed to the outside of the housing (e.g., the second structure 102 in FIGS. 5A to 5C) of the electronic device.

According to an embodiment, the electronic device may identify length (or area) information of the exposed area of the display using the information received from the sensor 676.

In operation 1103, the electronic device (e.g., the electronic device 100 in FIGS. 1 to 5C or the electronic device 601 in FIG. 6) may identify that power state information of the electronic device corresponds to a condition in which the remaining power of the battery (e.g., the battery 689 in FIG. 6) is less than or equal to a second threshold among the second conditions.

According to an embodiment, the electronic device may compare the power stored in the battery with the second threshold, and, if the power of the battery is equal to or less than the second threshold for determining the discharged state of the battery as a result of the comparison, may determine the battery of the electronic device is in the discharged state.

In operation 1105, the electronic device (e.g., the electronic device 100 in FIGS. 1 to 5C or the electronic device 601 in FIG. 6) may store the size information of the exposed area of the display.

According to an embodiment, if it is determined that the battery of the electronic device is in the discharged state, the electronic device may store the current size information of the exposed area of the display (e.g., the second state in FIG. 5B or the third state in FIG. 5C) before power-off in a memory (e.g., the memory 630 in FIG. 6).

In operation 1107, the electronic device (e.g., the electronic device 100 in FIGS. 1 to 5C or the electronic device 601 in FIG. 6) may reduce the size of the exposed area of the display to the first state (e.g., the first state in FIG. 5) in which the first area A1 of the display (e.g., the display 103 in FIGS. 1 to 5C or the display 660 in FIG. 6) is exposed and in which the entirety of the second area A2 of the display is inserted into the housing (e.g., the second structure 102 in the FIGS. 5A to 5C) of the electronic device.

According to an embodiment, if it is determined to turn off the power of the electronic device, the electronic device may change the size of the exposed area of the display to a default size (e.g., the first state in FIG. 5A).

According to an embodiment, if it is determined to turn off the power of the electronic device, the electronic device may reduce the size (e.g., length or area) of the exposed area of the display to correspond to configured default size information.

In operation 1109, the electronic device (e.g., the electronic device 100 in FIGS. 1 to 5C or the electronic device 601 in FIG. 6) may turn off the power of the electronic device.

According to an embodiment, if it is identified that the size of the exposed area of the display is changed to the configured default size (e.g., the first state in FIG. 5A), the electronic device may turn off the power of the electronic device.

Figure 12A:
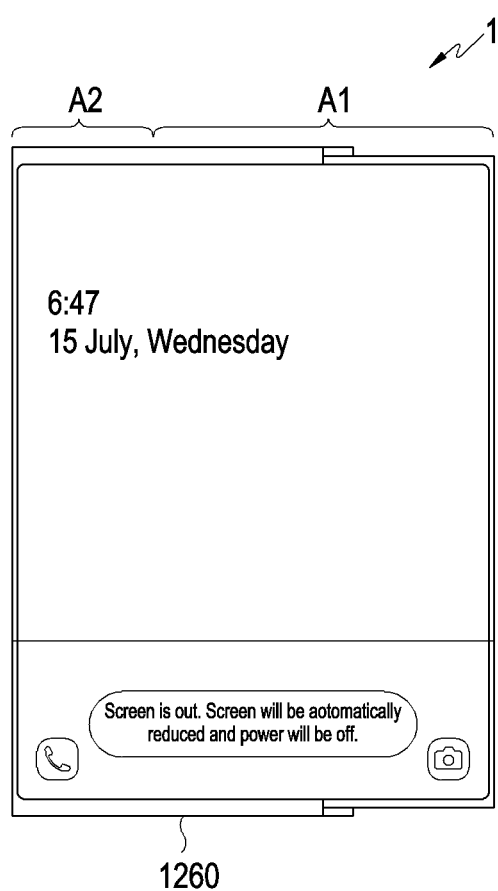
FIGS. 12A and 12B are diagrams illustrating an example operation of changing the size of an exposed area of a display based on turning off the power of an electronic device according to various embodiments.
Figure 12B:
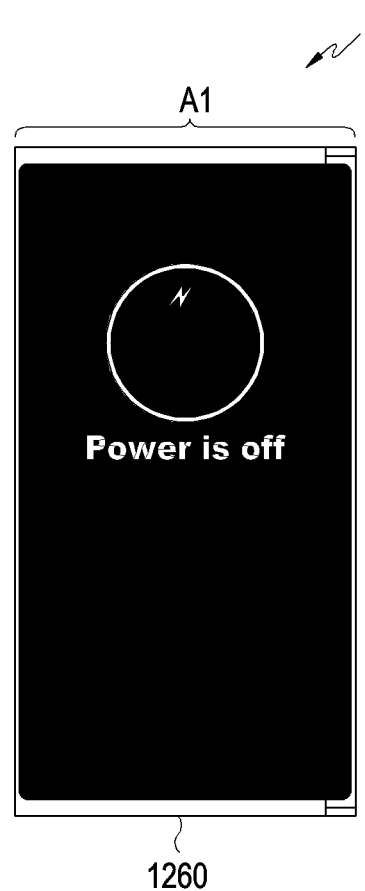

FIGS. 12A and 12B are diagrams illustrating an example operation of changing the size of an exposed area of a display based on turning off the power of an electronic device according to various embodiments.

Referring to FIG. 12A, an electronic device 1201 (e.g., the electronic device 100 in FIGS. 1 to 5C or the electronic device 601 in FIG. 6) may identify that the battery power of the electronic device is less than or equal to a second threshold indicating the discharged state of the battery in the third state (e.g., the third state in FIG. 5C) in which the entirety of a second area A2 of a display 1260 (e.g., the display 103 in FIGS. 1 to 5C or the display 660 in FIG. 6) is exposed to the outside of a housing (e.g., the second structure 102 in FIG. 5C) of the electronic device. As shown in FIG. 12B, if it is identified that the battery of the electronic device is in the discharged state, the electronic device may switch to the first state (e.g., the first state in FIG. 5A) in which the entirety of the second area A2 of the display is inserted into the housing of the electronic device and then turn off the power of the electronic device.

Figure 13:
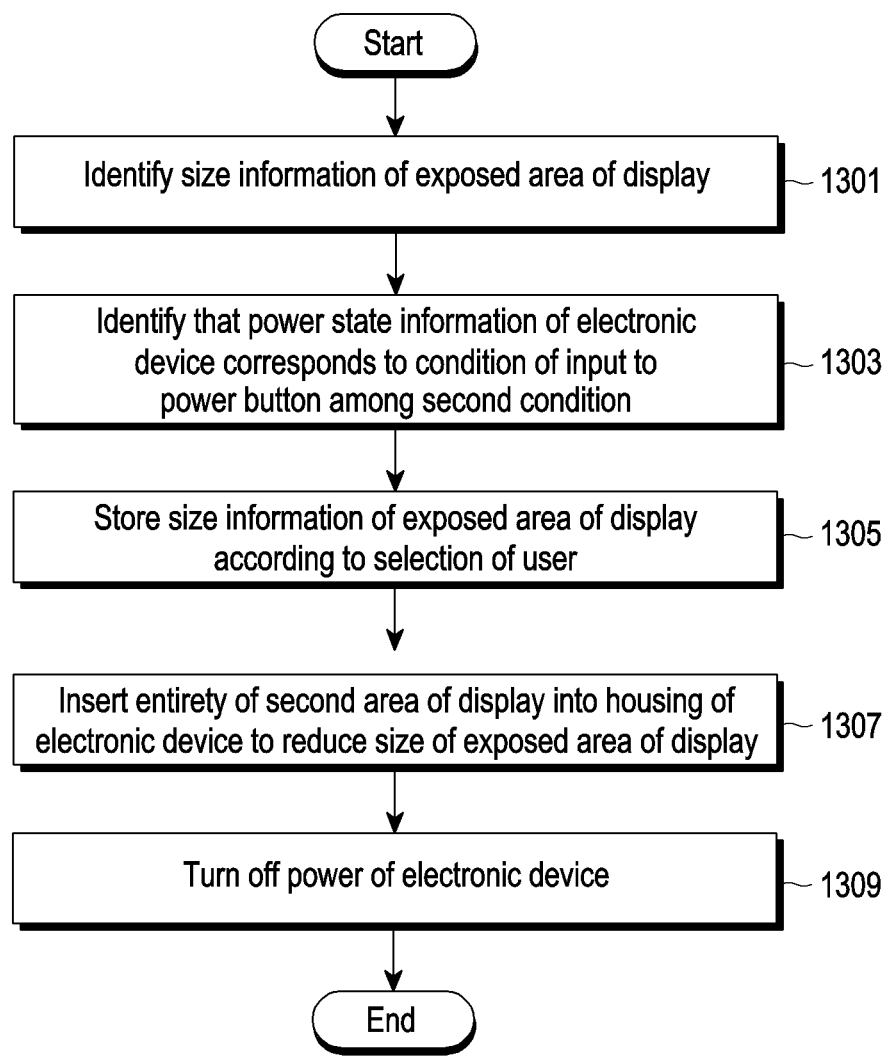
FIG. 13 is a flowchart illustrating an example operation of changing the size of an exposed area of a display based on turning off the power of an electronic device according to various embodiments.

FIG. 13 is a flowchart illustrating an example operation of changing the size of an exposed area of a display based on turning off the power of an electronic device according to various embodiments. The operation of changing the size of the exposed area of the display may include operations 1301, 1303, 1305, 1307 and 1309 (which may be referred to hereinafter as operations 1301 to 1309). According to an embodiment, at least one of operations 1301 to 1309 may be omitted, the sequence of some operations may be changed, or other operations may be added thereto. Operations 1301 to 1309 may be conducted by, for example, an element (e.g., the processor 620 in FIG. 6) of an electronic device (e.g., the electronic device 100 in FIGS. 1 to 5C, the electronic device 601 in FIG. 6, or the electronic device 1701 in FIG. 17).

In operation 1301, the electronic device (e.g., the electronic device 100 in FIGS. 1 to 5C or the electronic device 601 in FIG. 6) may identify size information of the exposed area of a display (e.g., the display 103 in FIGS. 5A to 5C or the display 660 in FIG. 6).

According to an embodiment, the electronic device may identify the size information of the exposed area of the display using information received from a sensor (e.g., the sensor 676 in FIG. 6).

According to an embodiment, the electronic device, using the information received from the sensor, may identify the second state (e.g., the second state in FIG. 5B) in which the first area A1 of the display is exposed and a portion of the second area A2 of the display is exposed to the outside of the housing of the electronic device.

According to an embodiment, the electronic device, using the information received from the sensor 676, may identify the third state (e.g., the third state in FIG. 5C) in which the first area A1 of the display is exposed and the entirety of the second area A2 is exposed to the outside of the housing (e.g., the second structure 102 in FIGS. 5A to 5C) of the electronic device.

According to an embodiment, the electronic device may identify length (or area) information of the exposed area of the display using the information received from the sensor 676.

In operation 1303, the electronic device (e.g., the electronic device 100 in FIGS. 1 to 5C or the electronic device 601 in FIG. 6) may identify that power state information of the electronic device corresponds to a condition for input to the power button of the electronic device among the second conditions.

In operation 1305, the electronic device (e.g., the electronic device 100 in FIGS. 1 to 5C or the electronic device 601 in FIG. 6) may store the size information of the exposed area of the display according to the user's selection.

According to an embodiment, if selection for turning off the power of the electronic device is identified through an input to the power button of the electronic device, the electronic device may enquire of the user about whether or not to store the size information of the exposed area of the display before turning off the power of the electronic device, and store, in the memory (e.g., the memory 630 in FIG. 6), the current size information of the exposed area of the display before turning off the power (e.g., the second state in FIG. 5B or the third state in FIG. 5C) if the user selects storing.

In operation 1307, in the state in which the first area A1 of the display (e.g., the display 103 in FIGS. 1 to 5C or the display 660 in FIG. 6) is exposed, the electronic device (e.g., the electronic device 100 in FIGS. 1 to 5C or the electronic device 601 in FIG. 6) may reduce the size of the exposed area of the display to the first state (e.g., the first state in FIG. 5) in which the entirety of the second area A2 of the display is inserted into the housing (e.g., the second structure 102 in FIGS. 5A to 5C) of the electronic device.

According to an embodiment, if it is determined to turn off the power of the electronic device, the electronic device may switch the size of the exposed area of the display to a default size (e.g., the first state in FIG. 5A).

According to an embodiment, if it is determined to turn off the power of the electronic device, the electronic device may reduce the size (e.g., length or area) of the exposed area of the display to correspond to configured default size information.

In operation 1309, the electronic device (e.g., the electronic device 100 in FIGS. 1 to 5C or the electronic device 601 in FIG. 6) may turn off the power of the electronic device.

According to an embodiment, if it is identified that the size of the exposed area of the display is changed to the configured default size (e.g., the first state in FIG. 5A), the electronic device may turn off the power of the electronic device.

Figures 14A, 14B:
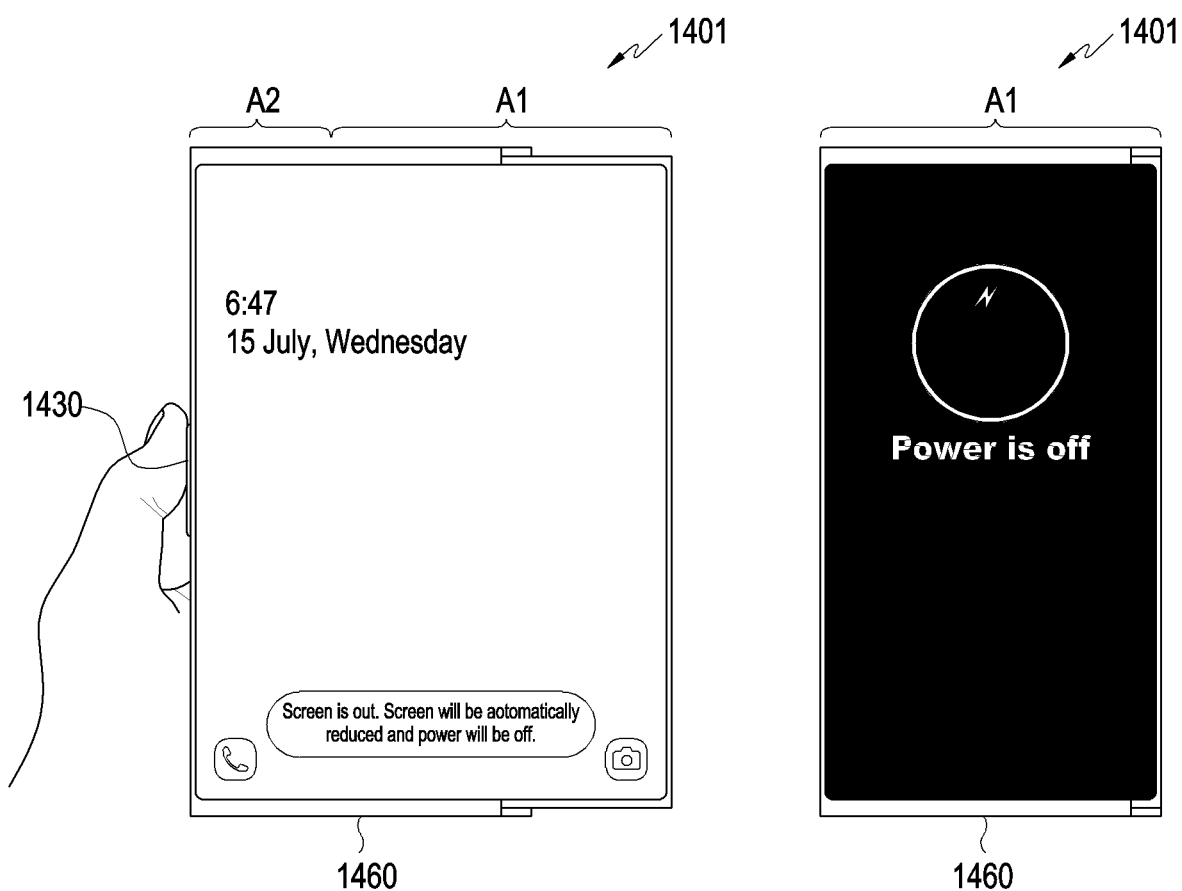
FIGS. 14A and 14B are diagrams illustrating an example operation of changing the size of an exposed area of a display based on turning off the power of an electronic device according to various embodiments.

FIGS. 14A and 14B are diagrams illustrating an example operation of changing the size of an exposed area of a display based on turning off the power of an electronic device according to various embodiments.

Referring to FIG. 14A, the electronic device 1201 (e.g., the electronic device 100 in FIGS. 1 to 5C or the electronic device 601 in FIG. 6), as shown in FIG. 14A, may identify an input to a power button 1430 of the electronic device for turning off the power of the electronic device in the third state (e.g., the third state in FIG. 5C) in which the entirety of the second area A2 of a display 1260 (e.g., the display 103 in FIGS. 1 to 5C or the display 660 in FIG. 6) is exposed to the outside of a housing (e.g., the second structure 102 in FIG. 5C) of the electronic device. If the input to the power button of the electronic device is identified, as shown in FIG. 14B, the electronic device may switch to the first state (e.g., the first state in FIG. 5A) in which the entirety of the second area A2 of the display is inserted into the housing of the electronic device, and then turn off the power of the electronic device.

Figure 15:
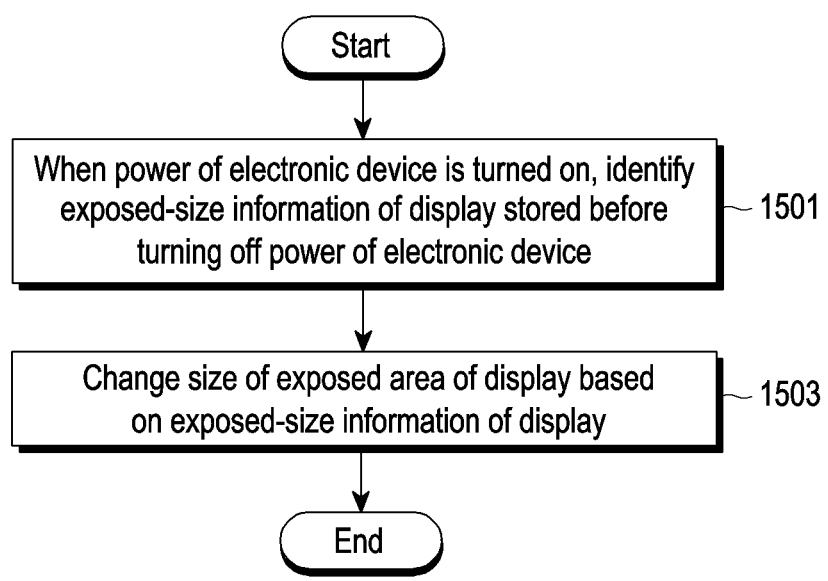
FIG. 15 is a flowchart illustrating an example operation of changing the size of an exposed area of a display based on turning on the power of an electronic device according to various embodiments.

FIG. 15 is a flowchart illustrating an example operation of changing the size of an exposed area of a display based on turning on the power of an electronic device according to various embodiments. The operation of changing the size of the exposed area of the display may include operations 1501 and 1503. According to an embodiment, at least one of operations 1501 to 1503 may be omitted, the sequence of some operations may be changed, or other operations may be added thereto. Operations 1501 to 1503 may be conducted by, for example, an element (e.g., the processor 620 in FIG. 6) of an electronic device (e.g., the electronic device 100 in FIGS. 1 to 5C, the electronic device 601 in FIG. 6, or the electronic device 1701 in FIG. 17).

In operation 1501, an electronic device (e.g., the electronic device 100 in FIGS. 1 to 5C or the electronic device 601 in FIG. 6) may identify size information of the exposed area of the display, which is stored before turning off the power of the electronic device, when the power of the electronic device is turned on.

According to an embodiment, the electronic device may detect the turning on of the power of the electronic device in the first state (e.g., the first state in FIG. 5A) in which the entirety of the second area A2 of the display is inserted into the housing of the electronic device.

According to an embodiment, the electronic device may identify whether or not there is size information of the exposed area of the display, which is stored before turning off the power of the electronic device, in a memory (e.g., the memory 630 in FIG. 6), and if there is the size information of the exposed area of the display in the memory, identify the size information of the exposed area of the display, which is stored before turning off the power of the electronic device.

In operation 1503, the electronic device (e.g., the electronic device 100 in FIGS. 1 to 5C or the electronic device 601 in FIG. 6) may change the size of the exposed area of the display (e.g., the display 103 in FIGS. 1 to 5C or the display 660 in FIG. 6) based on the size information of the exposed area of the display.

According to an embodiment, the electronic device, based on the size information of the exposed area of the display, may change the size of the exposed area of the display to the second state (e.g., the second state in FIG. 5B) in which the first area A1 of the display is exposed and in which a portion of the second area A2 of the display is exposed to the outside of the housing of the electronic device.

According to an embodiment, the electronic device, based on the size information of the exposed area of the display, may change the size of the exposed area of the display to the third state (e.g., the third state in FIG. 5C) in which the first area A1 of the display is exposed and in which the entirety of the second area A2 of the display is exposed to the outside of the housing (e.g., the second structure 102 in FIGS. 1 to 5C) of the electronic device.

According to an embodiment, the electronic device may change the size (e.g., length or area) of the exposed area of the display to correspond to the size information of the exposed area of the display.

Figure 16A:
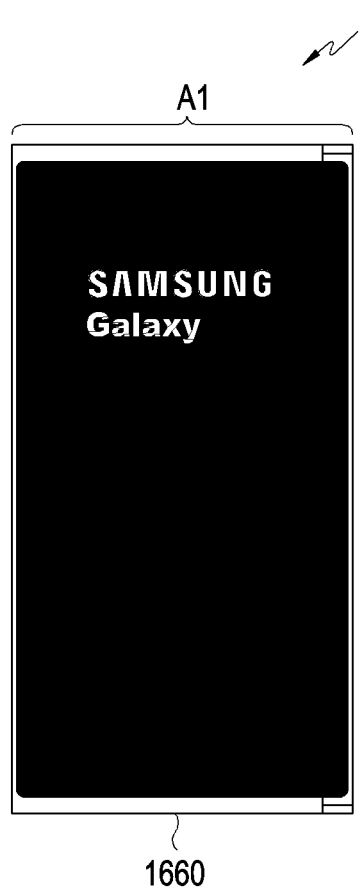
FIGS. 16A and 16B are diagrams illustrating an example operation of changing the size of an exposed area of a display based on turning on the power of an electronic device according to various embodiments.
Figure 16B:
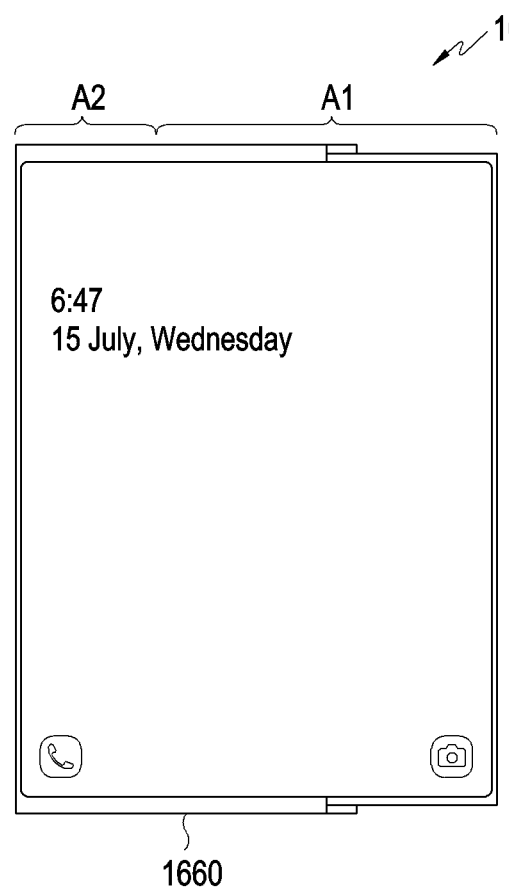

FIGS. 16A and 16B are diagrams illustrating an example operation of changing the size of an exposed area of a display according to turning on the power of an electronic device according to various embodiments.

Referring to FIG. 16A, an electronic device 1601 (e.g., the electronic device 100 in FIGS. 1 to 5C or the electronic device 601 in FIG. 6) may identify an input to a power button (e.g., the power button 1430 in FIG. 14) of the electronic device for turning on the power of the electronic device in the first state (e.g., the first state in FIG. 5A) in which the entirety of the second area A2 of a display 1660 (e.g., the display 103 in FIG. 5A or the display 660 in FIG. 6) is inserted into the housing (e.g., the second structure 102 in FIG. 5C) of the electronic device. If it is identified that the power of the electronic device is turned on, as shown in FIG. 16B, the electronic device, based on size information of the exposed area of the display stored before turning off the power of the electronic device in a memory (e.g., the memory 630 in FIG. 6), may change the size of the exposed area of the display to the third state (e.g., the third state in FIG. 5C) in which the entirety of the second area A2 of the display is exposed to the outside of the housing of the electronic device.

The electronic device (e.g., the electronic device 100 in FIGS. 1 to 5C or the electronic device 601 in FIG. 6) may be implemented to be the same or similar as the electronic device 1701 described below.

FIG. 17 is a block diagram illustrating an example electronic device in a network environment according to various embodiments.

Referring to FIG. 17, the electronic device 1701 in the network environment 1700 may communicate with an electronic device 1702 via a first network 1798 (e.g., a short-range wireless communication network), or an electronic device 1704 or a server 1708 via a second network 1799 (e.g., a long-range wireless communication network). According to an embodiment, the electronic device 1701 may communicate with the electronic device 1704 via the server 1708. According to an embodiment, the electronic device 1701 may include a processor 1720, memory 1730, an input module 1750, a sound output module 1755, a display module 1760, an audio module 1770, a sensor module 1776, an interface 1777, a connecting terminal 1778, a haptic module 1779, a camera module 1780, a power management module 1788, a battery 1789, a communication module 1790, a subscriber identification module (SIM) 1796, or an antenna module 1797. In various embodiments, at least one of the components (e.g., the connecting terminal 1778) may be omitted from the electronic device 1701, or one or more other components may be added in the electronic device 1701. In various embodiments, some of the components (e.g., the sensor module 1776, the camera module 1780, or the antenna module 1797) may be implemented as a single component (e.g., the display module 1760).

The processor 1720 may execute, for example, software (e.g., a program 1740) to control at least one other component (e.g., a hardware or software component) of the electronic device 1701 coupled with the processor 1720, and may perform various data processing or computation. According to an embodiment, as at least part of the data processing or computation, the processor 1720 may store a command or data received from another component (e.g., the sensor module 1776 or the communication module 1790) in volatile memory 1732, process the command or the data stored in the volatile memory 1732, and store resulting data in non-volatile memory 1734. According to an embodiment, the processor 1720 may include a main processor 1721 (e.g., a central processing unit (CPU) or an application processor (AP)), or an auxiliary processor 1723 (e.g., a graphics processing unit (GPU), a neural processing unit (NPU), an image signal processor (ISP), a sensor hub processor, or a communication processor (CP)) that is operable independently from, or in conjunction with, the main processor 1721. For example, when the electronic device 1701 includes the main processor 1721 and the auxiliary processor 1723, the auxiliary processor 1723 may be adapted to consume less power than the main processor 1721, or to be specific to a specified function. The auxiliary processor 1723 may be implemented as separate from, or as part of the main processor 1721.

The auxiliary processor 1723 may control, for example, at least some of functions or states related to at least one component (e.g., the display module 1760, the sensor module 1776, or the communication module 1790) among the components of the electronic device 101, instead of the main processor 1721 while the main processor 1721 is in an inactive (e.g., sleep) state, or together with the main processor 1721 while the main processor 1721 is in an active (e.g., executing an application) state. According to an embodiment, the auxiliary processor 1723 (e.g., an image signal processor or a communication processor) may be implemented as part of another component (e.g., the camera module 1780 or the communication module 1790) functionally related to the auxiliary processor 1723. According to an embodiment, the auxiliary processor 1723 (e.g., the neural processing unit) may include a hardware structure specified for artificial intelligence model processing. An artificial intelligence model may be generated by machine learning. Such learning may be performed, e.g., by the electronic device 1701 where the artificial intelligence is performed or via a separate server (e.g., the server 1708). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1730 may store various data used by at least one component (e.g., the processor 1720 or the sensor module 1776) of the electronic device 1701. The various data may include, for example, software (e.g., the program 1740) and input data or output data for a command related thereto. The memory 1730 may include the volatile memory 1732 or the non-volatile memory 1734.

The program 1740 may be stored in the memory 1730 as software, and may include, for example, an operating system (OS) 1742, middleware 1744, or an application 1746.

The input module 1750 may receive a command or data to be used by another component (e.g., the processor 1720) of the electronic device 1701, from the outside (e.g., a user) of the electronic device 1701. The input module 1750 may include, for example, a microphone, a mouse, a keyboard, a key (e.g., a button), or a digital pen (e.g., a stylus pen).

The sound output module 1755 may output sound signals to the outside of the electronic device 1701. The sound output module 1755 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 1760 may visually provide information to the outside (e.g., a user) of the electronic device 1701. The display module 1760 may include, for example, a display, a hologram device, or a projector and control circuitry to control a corresponding one of the display, hologram device, and projector. According to an embodiment, the display module 1760 may include a touch sensor adapted to detect a touch, or a pressure sensor adapted to measure the intensity of force incurred by the touch.

The audio module 1770 may convert a sound into an electrical signal and vice versa. According to an embodiment, the audio module 1770 may obtain the sound via the input module 1750, or output the sound via the sound output module 1755 or an external electronic device (e.g., an electronic device 1702 (e.g., a speaker or a headphone)) directly or wirelessly coupled with the electronic device 1701.

The sensor module 1776 may detect an operational state (e.g., power or temperature) of the electronic device 1701 or an environmental state (e.g., a state of a user) external to the electronic device 1701, and then generate an electrical signal or data value corresponding to the detected state. According to an embodiment, the sensor module 1776 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1777 may support one or more specified protocols to be used for the electronic device 1701 to be coupled with the external electronic device (e.g., the electronic device 1702) directly or wirelessly. According to an embodiment, the interface 1777 may include, for example, a high definition multimedia interface (HDMI), a universal serial bus (USB) interface, a secure digital (SD) card interface, or an audio interface.

A connecting terminal 1778 may include a connector via which the electronic device 1701 may be physically connected with the external electronic device (e.g., the electronic device 1702). According to an embodiment, the connecting terminal 1778 may include, for example, a HDMI connector, a USB connector, a SD card connector, or an audio connector (e.g., a headphone connector).

The haptic module 1779 may convert an electrical signal into a mechanical stimulus (e.g., a vibration or a movement) or electrical stimulus which may be recognized by a user via his tactile sensation or kinesthetic sensation. According to an embodiment, the haptic module 1779 may include, for example, a motor, a piezoelectric element, or an electric stimulator.

The camera module 1780 may capture a still image or moving images. According to an embodiment, the camera module 1780 may include one or more lenses, image sensors, image signal processors, or flashes.

The power management module 1788 may manage power supplied to the electronic device 1701. According to an embodiment, the power management module 1788 may be implemented as at least part of, for example, a power management integrated circuit (PMIC).

The battery 1789 may supply power to at least one component of the electronic device 1701. According to an embodiment, the battery 1789 may include, for example, a primary cell which is not rechargeable, a secondary cell which is rechargeable, or a fuel cell.

The communication module 1790 may support establishing a direct (e.g., wired) communication channel or a wireless communication channel between the electronic device 1701 and the external electronic device (e.g., the electronic device 1702, the electronic device 1704, or the server 1708) and performing communication via the established communication channel. The communication module 1790 may include one or more communication processors that are operable independently from the processor 1720 (e.g., the application processor (AP)) and supports a direct (e.g., wired) communication or a wireless communication. According to an embodiment, the communication module 1790 may include a wireless communication module 1792 (e.g., a cellular communication module, a short-range wireless communication module, or a global navigation satellite system (GNSS) communication module) or a wired communication module 1794 (e.g., a local area network (LAN) communication module or a power line communication (PLC) module). A corresponding one of these communication modules may communicate with the external electronic device 1704 via the first network 1798 (e.g., a short-range communication network, such as Bluetooth™, wireless-fidelity (Wi-Fi) direct, or infrared data association (IrDA)) or the second network 1799 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1792 may identify or authenticate the electronic device 1701 in a communication network, such as the first network 1798 or the second network 1799, using subscriber information (e.g., international mobile subscriber identity (IMSI)) stored in the subscriber identification module 196.

The wireless communication module 1792 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 1792 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 1792 may support various requirements specified in the electronic device 1701, an external electronic device (e.g., the electronic device 1704), or a network system (e.g., the second network 1799). According to an embodiment, the wireless communication module 1792 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 1797 may transmit or receive a signal or power to or from the outside (e.g., the external electronic device) of the electronic device 1701. According to an embodiment, the antenna module 1797 may include an antenna including a radiating element including a conductive material or a conductive pattern formed in or on a substrate (e.g., a printed circuit board (PCB)). According to an embodiment, the antenna module 1797 may include a plurality of antennas (e.g., array antennas). In such a case, at least one antenna appropriate for a communication scheme used in the communication network, such as the first network 1798 or the second network 1799, may be selected, for example, by the communication module 1790 from the plurality of antennas. The signal or the power may then be transmitted or received between the communication module 1790 and the external electronic device via the selected at least one antenna. According to an embodiment, another component (e.g., a radio frequency integrated circuit (RFIC)) other than the radiating element may be additionally formed as part of the antenna module 1797.

According to various embodiments, the antenna module 1797 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1701 and the external electronic device 1704 via the server 1708 coupled with the second network 1799. Each of the electronic devices 1702 or 1704 may be a device of a same type as, or a different type, from the electronic device 1701. According to an embodiment, all or some of operations to be executed at the electronic device 1701 may be executed at one or more of the external electronic devices 1702, 1704, or 1708. For example, if the electronic device 1701 should perform a function or a service automatically, or in response to a request from a user or another device, the electronic device 1701, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1701. The electronic device 1701 may provide the outcome, with or without further processing of the outcome, as at least part of a reply to the request. To that end, a cloud computing, distributed computing, mobile edge computing (MEC), or client-server computing technology may be used, for example. The electronic device 1701 may provide ultra low-latency services using, e.g., distributed computing or mobile edge computing. In another embodiment, the external electronic device 1704 may include an internet-of-things (IoT) device. The server 1708 may be an intelligent server using machine learning and/or a neural network. According to an embodiment, the external electronic device 1704 or the server 1708 may be included in the second network 1799. The electronic device 1701 may be applied to intelligent services (e.g., smart home, smart city, smart car, or healthcare) based on 5G communication technology or IoT-related technology.

According to various example embodiments, a method of operating an electronic device may include: identifying size information of an area visible in front face of the electronic device by moving a flexible display including a first area and a second area extending from the first area moves from the housing of the electronic device, and displaying, on the display, information related to an available usage time of the electronic device on the basis of the identified size information and the remaining amount of the battery.

According to various example embodiments, the method may further include, based on power state information including the remaining amount of the battery of the electronic device corresponding to a first condition, restricting movement of the display to inhibit expansion of the size of the visible area of the display, or displaying, on the display, guide information for reducing the size of the visible area of the display.

According to various example embodiments, the first condition may indicate that the remaining power of the battery is equal to or less than a first threshold.

According to various example embodiments, the first condition may indicate that the remaining power of the battery is equal to or less than a first threshold in a state in which an external power source is not connected to the electronic device.

According to various example embodiments, the display may be moved using a display driving module included in the electronic device.

According to various example embodiments, the method may further include, based on first battery saving information being selected from among at least one piece of battery saving information included in the guide information, moving the second area to reduce the size of the visible area of the display based on size information of the visible area of the display, included in the first battery saving information.

According to various example embodiments, the method may further include, based on a first guide line being selected from among at least one guide line while displaying the at least one guide line for visually indicating at least one piece of size information of the visible area of the display, included in the guide information, moving the second area so that the visible area of the display correspond to the first guide line, thereby reducing the size of the visible area of the display.

According to various example embodiments, the method may further include, based on power state information of the electronic device corresponding to a second condition, inserting the entirety of the second area into the housing to reduce the size of the visible area of the display and turning off the power of the electronic device.

According to various example embodiments, the second condition may indicate that the remaining power of the battery is equal to or less than a second threshold or indicate an input to a power button of the electronic device.

According to various example embodiments, the method may further include storing information on the visible size of the display before the power of the electronic device is turned off.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

What is claimed is:

1. An electronic device comprising:
   a housing including a first housing structure and a second housing structure, wherein the first housing structure is configured to move relative to the second housing structure;
   a battery;
   a flexible display comprising a first area and a second area extending from the first area, wherein the second area is disposed on the first housing structure visibly to a front face of the electronic device, wherein at least part of the second area is configured to be visible to the front of the electronic device and/or be inserted into the second housing structure based on movement of the first housing structure to change a size of a visible area to the front face of the electronic device;
   a sensor configured to identify information related to the size of the visible area of the flexible display; and
   a processor,
   wherein the processor is configured to:
   identify a first size of the visible area of the flexible display using the identified information received from the sensor,
   identify a state of the battery, when the identified state of the battery is less than or equal to a first threshold, control the flexible display to display at least one user interface based on the identified first size and the identified state of the battery, wherein the at least one user interface includes information related to a second size to be changeable from the first size and an available usage time and/or the battery saving corresponding to the second size, receive an input on the at least one user interface to change the first size into the second size, in response to the input, move the first housing structure to change the size of the visible area of the flexible display into the second size, and when the state of the battery is less than or equal to a second threshold less than the first threshold, control the electronic device to turn off.

2. The electronic device of claim 1, wherein the processor is configured to, if the identified state of the battery is less than or equal to the first threshold, restrict movement of the first structure to inhibit to change the size of the visible area of the flexible display into the first size.

3. The electronic device of claim 1, wherein the processor is configured to, based on moving the first structure to change the size of the visible area of the flexible display into the second size, control the flexible display to display information related to the battery saving corresponding to the second size.

4. The electronic device of claim 1, further comprising a display driving module comprising circuitry configured to move the first structure.

5. The electronic device of claim 4, wherein the processor is configured to, when the state of the battery is less than or equal to the second threshold less than the first threshold, control the display driving module to move the first structure to reduce the size of the visible area of the flexible display into the first size before turning off the power of the electronic device.

6. The electronic device of claim 1, wherein the processor is configured to, when the identified state of the battery is less than or equal to the first threshold, control the flexible display to display a user interface including information related to a third size to be changeable from the first size and an available usage time or the battery saving corresponding to the third size, wherein the third size is different to the second size.

7. The electronic device of claim 6, wherein the processor is configured to, based on an input on the user interface to change the first size into the third size, move the first structure to change the size of the visible area of the flexible display into the third size.

8. The electronic device of claim 1, wherein the processor is configured to, when the state of the battery is less than or equal to the second threshold less than the first threshold, control the flexible display to display information related to reducing the size of the visible area of the flexible display, control to move the first structure to insert the second area into the housing second structure to reduce the size of the visible area of the flexible display and turn off the power of the electronic device.

9. The electronic device of claim 8, further including a memory, and wherein the processor is configured to store in the memory at least one piece of size information of the visible area of the flexible display.

10. A method of operating an electronic device, the method comprising:

identifying a first size of a visible area of a flexible display, comprising a first area and a second area extending from the first area, using information received from a sensor, wherein the first area is disposed on a first structure, configured to move relatively with a second structure of a housing, visibly to a front face of the electronic device, and wherein at least part of the second area is visible to the front of the electronic device and/or is inserted into the second structure of the housing according to moving of the first structure to change a size of the visible area to the front face of the electronic device;

identifying a state of the battery;

when the identified state of the battery is less than or equal to a first threshold, controlling the flexible display to display at least one user interface based on the identified first size and the identified state of the battery, wherein the at least one user interface includes information related to a second size to be changeable from the first size and an available usage time and/or the battery saving corresponding to the second size, receiving an input on the at least one user interface to change the first size into the second size, in response to the input, moving the first structure to change the size of the visible area of the flexible display into the second size, and when the state of the battery is less than or equal to a second threshold less than the first threshold, controlling the electronic device to turn off.

11. The method of claim 10, further comprising, when the identified state of the battery is less than or equal to the first threshold, restricting movement of the first structure to inhibit to change the size of the visible area of the flexible display into the first size.

12. The method of claim 11, further comprising, when the state of the battery is less than or equal to the second threshold less than the first threshold, controlling a display driving module to move the first structure to reduce the size of the visible area of the flexible display into the first size before turning off the power of the electronic device.

13. The method of claim 10, based on moving the first structure to change the size of the visible area of the flexible display into the second size, controlling the flexible display to display information related to the battery saving corresponding to the second size.

14. The method of claim 10, further comprising, when the identified state of the battery is less than or equal to the first threshold, controlling the flexible display to display a user interface including information related to a third size to be changeable from the first size and an available usage time or the battery saving corresponding to the third size, wherein the third size is different to the second size.

15. The method of claim 14, further comprising, based on an input on the user interface to change the first size into the third size, moving the first structure to change the size of the visible area of the flexible display into the third size.

16. The method of claim 10, further comprising, when the state of the battery is less than or equal to the second threshold less than the first threshold, controlling the flexible display to display information related to reducing the size of the visible area of the flexible display, and controlling to move the first structure to insert the second area into the second structure to reduce the size of the visible area of the flexible display and turn off the power of the electronic device.

17. The method of claim 14, further comprising, storing at least one piece of size information of the visible area of the flexible display.

\* \* \* \* \*